US011127470B2

(12) United States Patent
Sako

(10) Patent No.: US 11,127,470 B2
(45) Date of Patent: Sep. 21, 2021

(54) SEMICONDUCTOR MEMORY DEVICE

(71) Applicant: KIOXIA CORPORATION, Tokyo (JP)

(72) Inventor: Mario Sako, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/902,145

(22) Filed: Jun. 15, 2020

(65) Prior Publication Data

US 2021/0090661 A1    Mar. 25, 2021

(30) Foreign Application Priority Data

Sep. 19, 2019    (JP) .............................. JP2019-170347

(51) Int. Cl.
G11C 16/26    (2006.01)
G11C 16/24    (2006.01)
G11C 16/34    (2006.01)

(52) U.S. Cl.
CPC .............. *G11C 16/24* (2013.01); *G11C 16/26* (2013.01); *G11C 16/3459* (2013.01)

(58) Field of Classification Search
CPC ..... G11C 16/24; G11C 16/3459; G11C 16/26; G11C 16/10; G11C 16/0483
See application file for complete search history.

(56) References Cited

U.S. PATENT DOCUMENTS

| 7,855,914 B2 | 12/2010 | Shibata |
| 8,068,361 B2 | 11/2011 | Kang et al. |
| 9,171,631 B2 | 10/2015 | Kamata et al. |
| 9,552,882 B2* | 1/2017 | Tseng .................. G11C 11/5628 |
| 2009/0267128 A1 | 10/2009 | Maejima |
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2017/0263325 A1 | 9/2017 | Kamata et al. |

FOREIGN PATENT DOCUMENTS

| JP | 2007141447 A | 6/2007 |
| JP | 5127350 B2 | 7/2007 |

* cited by examiner

*Primary Examiner* — David Lam
(74) *Attorney, Agent, or Firm* — Holtz, Holtz & Volek PC

(57) ABSTRACT

According to one embodiment, a semiconductor memory device includes: a first bit line; a first memory cell electrically coupled to the first bit line; and a first sense amplifier configured to sense and store data read out to the first bit line. The first sense amplifier includes a first latch circuit and a second latch circuit. In a program operation, each of the first and second latch circuits stores any one bit of program data. In a first verify operation, data is exchanged between the first latch circuit and the second latch circuit when performing the first verify operation for a first data.

20 Claims, 22 Drawing Sheets

| Verify target state \ Loop count | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "A" state (VfyA) | ○ | ○ | ○ | ○ | ○ | ○ |   |   |   |   |   |   |   |   |   |   |   |   |   |
| "B" state (VfyB) |   |   | ○ | ○ | ○ | ○ | ○ | ○ |   |   |   |   |   |   |   |   |   |   |   |
| "C" state (VfyC) |   |   |   |   | ○ | ○ | ○ | ○ | ○ | ○ |   |   |   |   |   |   |   |   |   |
| "D" state (VfyD) |   |   |   |   |   |   | ○ | ○ | ○ | ○ | ○ | ○ |   |   |   |   |   |   |   |
| "E" state (VfyE) |   |   |   |   |   |   |   |   | ○ | ○ | ○ | ○ | ○ | ○ |   |   |   |   |   |
| "F" state (VfyF) |   |   |   |   |   |   |   |   |   |   |   | ○ | ○ | ○ | ○ | ○ |   |   |   |
| "G" state (VfyG) |   |   |   |   |   |   |   |   |   |   |   |   |   | ○ | ○ | ○ | ○ | ○ | ○ |

F I G. 12

| Loop count / Write target state | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| "Er" state (inhibit) | 1 | 1 | 1 | 1 | 1 | 1 | 1 | 1 | 1 | 1 | 1 | 1 | 1 | 1 | 1 | 1 | 1 | 1 | 1 |
| "A" state | 0/1 | 0/1 | 0/1 | 0/1 | 0/1 | 0/1 | 1 | 1 | 1 | 1 | 1 | 1 | 1 | 1 | 1 | 1 | 1 | 1 | 1 |
| "B" state | 0 | 0 | 0/1 | 0/1 | 0/1 | 0/1 | 0/1 | 1 | 1 | 1 | 1 | 1 | 1 | 1 | 1 | 1 | 1 | 1 | 1 |
| "C" state | 0 | 0 | 0 | 0 | 0/1 | 0/1 | 0/1 | 0/1 | 0/1 | 1 | 1 | 1 | 1 | 1 | 1 | 1 | 1 | 1 | 1 |
| "D" state | 0 | 0 | 0 | 0 | 0 | 0/1 | 0/1 | 0/1 | 0/1 | 0/1 | 0/1 | 0/1 | 1 | 1 | 1 | 1 | 1 | 1 | 1 |
| "E" state | 0 | 0 | 0 | 0 | 0 | 0 | 0 | 0 | 0 | 0/1 | 0/1 | 0/1 | 0/1 | 0/1 | 1 | 1 | 1 | 1 | 1 |
| "F" state | 0 | 0 | 0 | 0 | 0 | 0 | 0 | 0 | 0 | 0 | 0 | 0/1 | 0/1 | 0/1 | 0/1 | 0/1 | 1 | 1 | 1 |
| "G" state | 0 | 0 | 0 | 0 | 0 | 0 | 0 | 0 | 0 | 0 | 0 | 0 | 0 | 0/1 | 0/1 | 0/1 | 0/1 | 0/1 | 0/1 |

FIG. 13

|     | Er | A | B | C | D | E | F | G |
|-----|----|----|----|----|----|----|----|----|
| ADL | 1 | 0 | 0 | 0 | 0 | 1 | 1 | 1 |
| BDL | 1 | 1 | 0 | 0 | 1 | 1 | 0 | 0 |
| SDL | 1 | 1 | 1 | 0 | 0 | 0 | 0 | 1 |
FIG. 15A
FIG. 15B
FIG. 15C

|  | Er | A | B | C | D | E | F | G |
|---|---|---|---|---|---|---|---|---|
| ADL | 1 | 1 | 1 | 0 | 0 | 0 | 0 | 1 |
| BDL | 1 | 1 | 0 | 0 | 1 | 1 | 0 | 0 |
| SDL | 1 | 1 | 0 | 0 | 0 | 1 | 1 | 1 |

↑ Update state "A" to 1

F I G. 15D

|  | Er | A | B | C | D | E | F | G |
|---|---|---|---|---|---|---|---|---|
| ADL | 1 | 1 | 0 | 0 | 0 | 1 | 1 | 1 |
| BDL | 1 | 1 | 0 | 0 | 1 | 1 | 0 | 0 |
| SDL | 1 | 1 | 1 | 0 | 0 | 0 | 0 | 1 |

Restore

F I G. 15E

|  | Er | A | B | C | D | E | F | G |
|---|---|---|---|---|---|---|---|---|
| ADL | 1 | 1 | 1 | 0 | 0 | 1 | 1 | 1 |
| BDL | 1 | 1 | 1 | 0 | 1 | 1 | 0 | 0 |
| SDL | 1 | 1 | 1 | 0 | 0 | 0 | 0 | 1 |

F I G. 15F

|     | Er | A | B | C | D | E | F | G |
|-----|----|----|----|----|----|----|----|----|
| ADL | 1 | 1 | 1 | 0 | 0 | 0 | 0 | 1 |
| BDL | 1 | 1 | 1 | 0 | 1 | 1 | 0 | 0 |
| SDL | 1 | 1 | 1 | 0 | 0 | 1 | 1 | 1 |

ADL ↔ SDL Exchange

F I G. 15G

|     | Er | A | B | C | D | E | F | G |
|-----|----|----|----|----|----|----|----|----|
| ADL | 1 | 1 | 1 | 0 | 0 | 1 | 1 | 1 |
| BDL | 1 | 1 | 1 | 0 | 1 | 1 | 0 | 0 |
| SDL | 1 | 1 | 1 | 0 | 0 | 0 | 0 | 1 |

ADL ↔ SDL Restore

F I G. 15H

|     | Er | A | B | C | D | E | F | G |
|-----|----|----|----|----|----|----|----|----|
| ADL | 1 | 1 | 1 | 1 | 1 | 1 | 1 | 1 |
| BDL | 1 | 1 | 1 | 1 | 1 | 1 | 0 | 0 |
| SDL | 1 | 1 | 1 | 1 | 1 | 0 | 0 | 1 |

F I G. 15I

|     | Er | A | B | C | D | E | F | G |
|-----|----|----|----|----|----|----|----|----|
| ADL | 1 | 1 | 1 | 1 | 1 | 1 | 1 | 1 |
| BDL | 1 | 1 | 1 | 1 | 1 | 0 | 0 | 1 |
| SDL | 1 | 1 | 1 | 1 | 1 | 1 | 0 | 0 |

BDL ↔ SDL Exchange

F I G. 15J

|  | Er | A | B | C | D | E | F | G |
|---|---|---|---|---|---|---|---|---|
| ADL | 1 | 1 | 1 | 1 | 1 | 1 | 1 | 1 |
| BDL | 1 | 1 | 1 | 1 | 1 | 1 | 0 | 0 |
| SDL | 1 | 1 | 1 | 1 | 1 | 0 | 0 | 1 |

⎫ Restore

F I G. 15K

|  | Er | A | B | C | D | E | F | G |
|---|---|---|---|---|---|---|---|---|
| ADL | 1 | 1 | 1 | 1 | 1 | 1 | 1 | 1 |
| BDL | 1 | 1 | 1 | 1 | 1 | 1 | 0 | 0 |
| SDL | 1 | 1 | 1 | 1 | 1 | 1 | 0 | 1 |

F I G. 15L

|  | Er | A | B | C | D | E | F | G |
|---|---|---|---|---|---|---|---|---|
| ADL | 1 | 1 | 1 | 1 | 1 | 1 | 1 | 1 |
| BDL | 1 | 1 | 1 | 1 | 1 | 1 | 0 | 1 |
| SDL | 1 | 1 | 1 | 1 | 1 | 1 | 0 | 0 |

⎫ Exchange

F I G. 15M

|  | Er | A | B | C | D | E | F | G |
|---|---|---|---|---|---|---|---|---|
| ADL | 1 | 1 | 1 | 1 | 1 | 1 | 1 | 1 |
| BDL | 1 | 1 | 1 | 1 | 1 | 1 | 0 | 0 |
| SDL | 1 | 1 | 1 | 1 | 1 | 1 | 0 | 1 |

⎫ Restore

F I G. 15N

SEMICONDUCTOR MEMORY DEVICE

CROSS-REFERENCE TO RELATED APPLICATION

This application is based upon and claims the benefit of priority from Japanese Patent Application No. 2019-170347, filed Sep. 19, 2019, the entire contents of which are incorporated herein by reference.

FIELD

Embodiments described herein relate generally to a semiconductor memory device.

BACKGROUND

As a semiconductor memory device, NAND flash memories are known.

BRIEF DESCRIPTION OF THE DRAWINGS

FIG. 12 is a diagram showing a relation between a loop count and the verify operation in the write operation of the semiconductor memory device according to one embodiment.

FIG. 13 is a diagram showing a relation between a loop count and a bit line voltage in the write operation of the semiconductor memory device according to one embodiment.

FIGS. 15A to 15N are views illustrating data stored in latch circuits in the write operation of the semiconductor memory device according to one embodiment.

DETAILED DESCRIPTION

Figure 1:
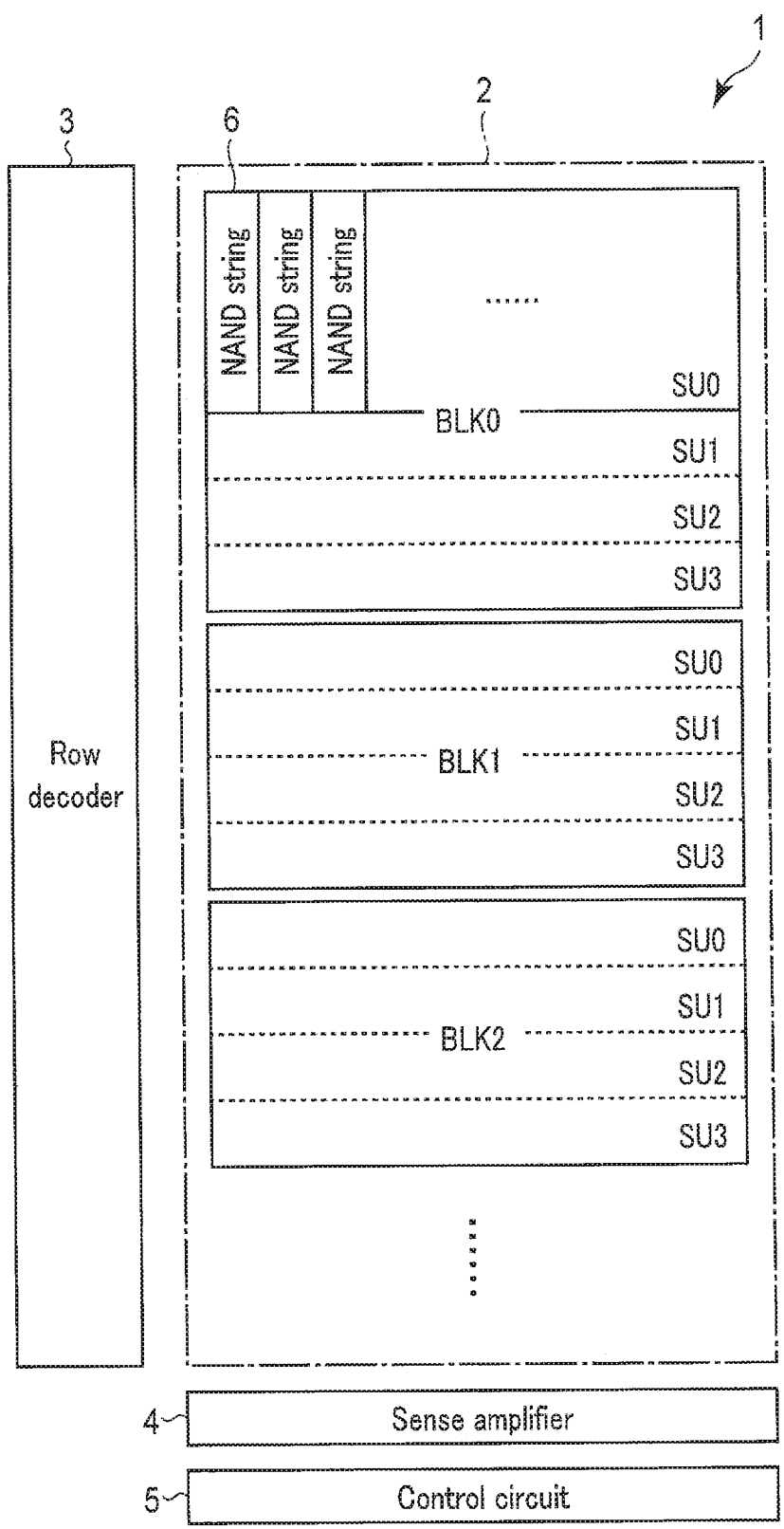
FIG. 1 is a block diagram of a semiconductor memory device according to one embodiment.

In general, according to one embodiment, a semiconductor memory device includes: a first bit line; a first memory cell electrically coupled to the first bit line and configured to store at least two-bit data; and a first sense amplifier configured to sense and store data read out to the first bit line. The first sense amplifier includes a first latch circuit and a second latch circuit. A data write operation is performed by repeating a loop including a program operation and a first verify operation. In the program operation, each of the first and second latch circuits stores any one bit of the at least two-bit data. In the first verify operation, data is exchanged between the first latch circuit and the second latch circuit when performing the first verify operation for a first data indicated by the at least two-bit data. The first verify operation for a second data indicated by the at least two-bit data is performed without exchanging data between the first latch circuit and the second latch circuit.

Hereinafter, embodiments will be described with reference to the drawings. In the description, common parts are assigned common reference numerals throughout the drawings.

1. Embodiment

A semiconductor memory device according to one embodiment will be described. As an example of the semiconductor memory device, a three-dimensionally stacked NAND flash memory, in which memory cell transistors are three-dimensionally stacked above a semiconductor substrate, will be described below.

1.1 Configuration

1.1.1 Overall Configuration of Semiconductor Memory Device

First, an overall configuration of a semiconductor memory device according to the present embodiment will be described with reference to FIG. 1. FIG. 1 is a block diagram of a NAND flash memory according to the present embodiment.

As shown in FIG. 1, a NAND flash memory 1 includes a memory cell array 2, a row decoder 3, a sense amplifier 4, and a control circuit 5.

The memory cell array 2 includes a plurality of blocks BLK (BLK0, BLK1, BLK2, . . . ), each including a plurality of non-volatile memory cells each associated with a row and a column. Each block BLK includes, for example, four string units SU (SU0 to SU3). Each string unit SU includes a plurality of NAND strings 6. The number of blocks in the memory cell array 2 and the number of the string units in each block are freely selected. The memory cell array 2 will be described in detail later.

The row decoder 3 decodes a row address, and based on a result of this decoding, selects one of the blocks BLK, and further selects one of the string units SU. The row decoder 3 applies a necessary voltage to the selected block BLK. For example, the row address is given by a controller which controls the NAND flash memory 1.

In a data read operation, the sense amplifier 4 senses data read from the memory cell array 2. The sense amplifier 4 then outputs the read data to the controller. In a data write operation, the sense amplifier 4 transfers write data, which is received from an external controller, to the memory cell array 2.

The control circuit 5 controls operations of the entire NAND flash memory 1.

1.1.2 Configuration of Block BLK

Next, a configuration of each of the aforementioned blocks BLK will be described with reference to FIG. 2. As described above, each of the blocks BLK includes, for example, four string units SU. Each of the string units SU includes the plurality of NAND strings 6.

Figure 2:
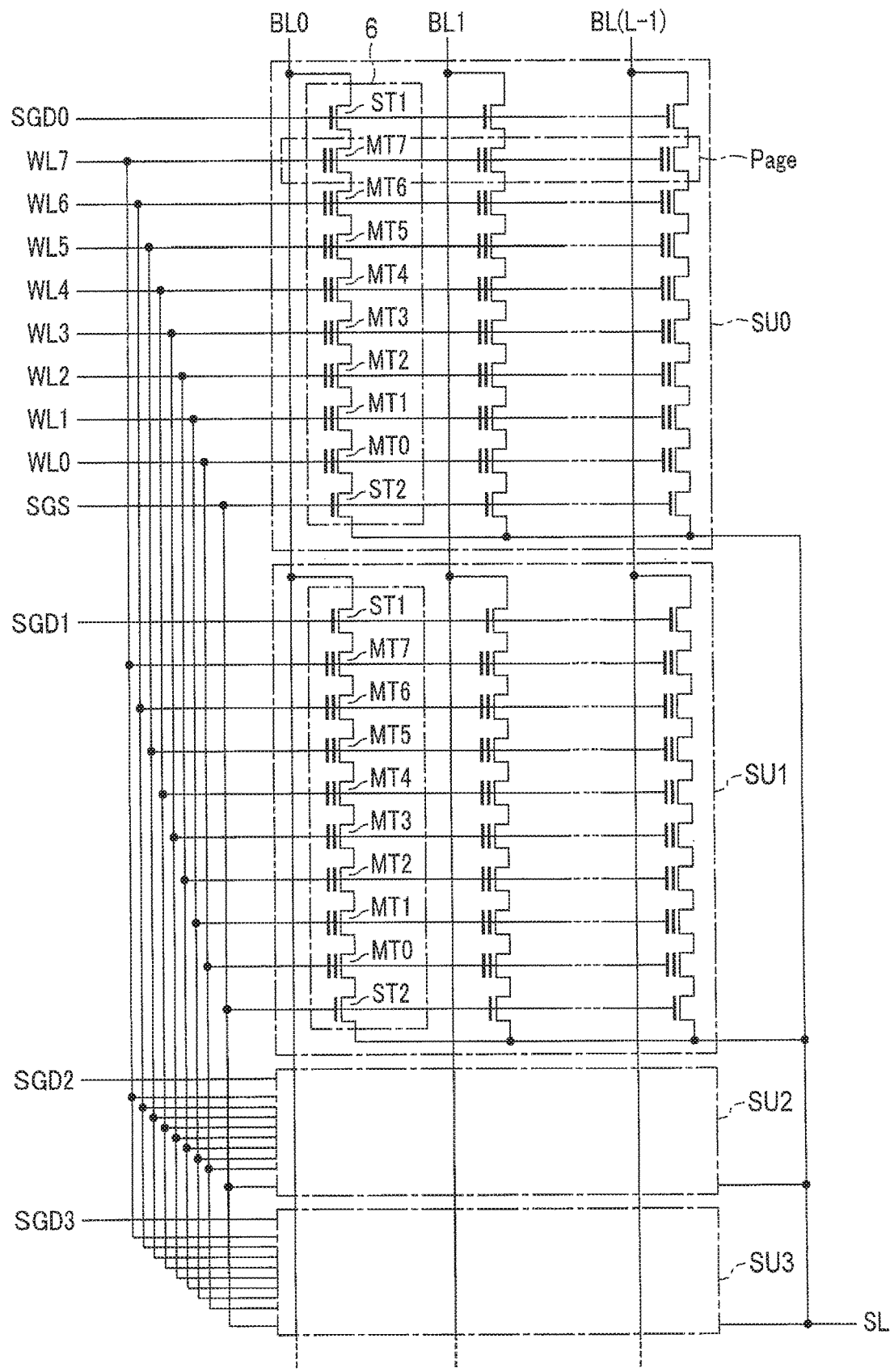
FIG. 2 is a circuit diagram of a memory cell array included in the semiconductor memory device according to one embodiment.

As shown in FIG. 2, each of the NAND strings 6 includes, for example, eight memory cell transistors MT (MT0 to MT7) and select transistors ST1 and ST2. The memory cell transistors MT each include a control gate and a charge storage layer, and store data in a nonvolatile manner. The memory cell transistors MT are coupled in series between a source of the select transistor ST1 and a drain of the select transistor ST2.

The string units SU0 to SU3 include select the transistors ST1 whose gates are coupled to select gate lines SGD0 to SGD3, respectively. On the other hand, the string units SU0 to SU3 include select the transistors ST2 whose gates are coupled to, for example, a common select gate line SOS. Needless to say, the gates of the select transistors ST2 may be coupled to respective different select gate lines SGS0 to SGS3. The memory cell transistors MT0 included in the same block BLK have their control gates coupled to a common word line NL0. The memory cell transistors MT1 to MT7 included in the same block BLK also have their control gates coupled to common word lines WL1 to WL7, respectively.

The NAND strings 6 included in one string unit SU have the select transistors ST1 whose drains are coupled to different bit lines (BL0 to BL(L−1) (where "L" represents an integer of 2 or more), respectively. The NAND strings 6 are included in each of the string units SU in such a manner that the corresponding NAND strings 6 among the string units SU are coupled to the same bit line BL among the plurality of blocks BLK. Furthermore, the plurality of select transistors ST2 have their sources coupled to a common source line SL.

Namely, each of the string units SU corresponds to a set of the NAND strings 6 that are respectively coupled to different bit lines BL and are coupled to the same select gate line SGD. Each of the blocks BLK corresponds to a set of the string units SU that share the same word lines WL. The memory cell array 2 corresponds to a set of the blocks BLK that, share the same bit lines BL.

In the present embodiment, one memory cell transistor MT is capable of storing, for example, three-bit data. Bits constituting this three-bit data will be referred to as a lower bit, a middle bit, and an upper bit in ascending order from the least significant bit. In one string unit SU, multiple memory cells coupled to the same word line WL store together a group of lower bits, which will be called a lower page, a group of middle bits, which will be called a middle page, and a group of upper bits, which will be called an upper page. In other words, a single word line WL is assigned three pages. Therefore, a "page" may also be defined as a portion of a memory space formed by the memory cells coupled to the same word line. A data write operation and a data read operation are performed for each page. In this example, a single string unit SU has eight word lines, which means that each string unit SU has (3 pages× 8)=24 pages, and a single block BLK has four string units SU, which means that each block BLK has (24 pages×4)=96 pages.

Figure 3:
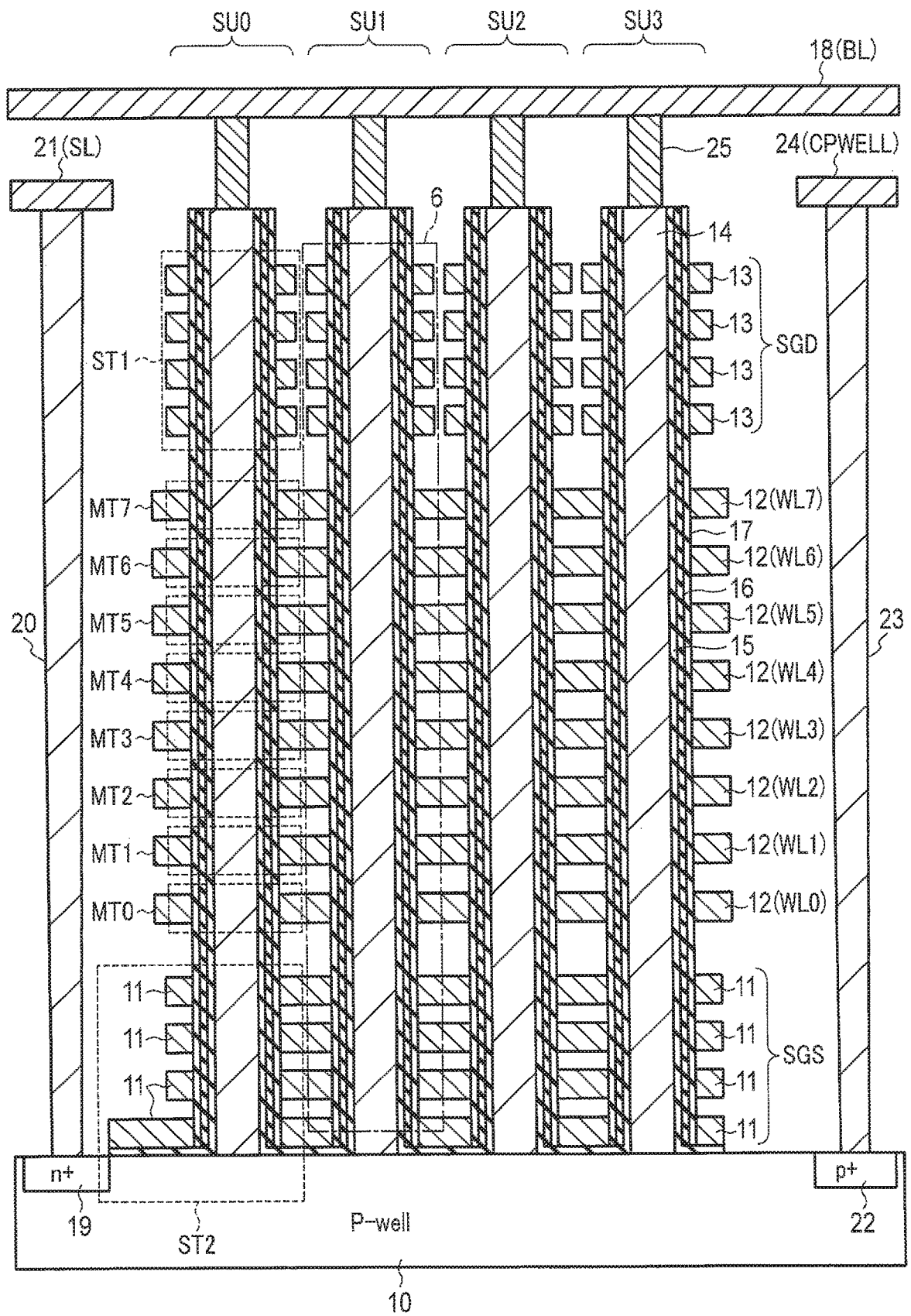
FIG. 3 is a sectional view of the memory cell array included in the semiconductor memory device according to one embodiment.

FIG. a is a cross-sectional view of a partial region of the block BLK. As shown in FIG. 3, the plurality of NAND strings 6 are formed above a p-type well region 10. Namely, for example, four layers of interconnect layers 11 respectively functioning s the select gate lines SGS, eight layers of interconnect layers 12 respectively functioning as the word lines WL0 to WLR, and four layers of interconnect layers 13 functioning as the select gate lines SGD are sequentially stacked above the well region 10. Insulating films (not shown) are formed between the stacked interconnect layers.

Pillar-shaped conductors 14 each extending through the interconnect layers 13, 12, and 11 to reach the well region 10 are formed. A gate insulating film 15, a charge storage layer (i.e., an insulating film or a conductive film) 16, and a block insulating film are sequentially formed on a side surface of each conductor 14, thereby forming the memory cell transistors MT and the select transistors ST1 and ST2. Each conductor 14 functions as a current path for each MANE string 6, and is used as a region in which a channel of each transistor is formed. Each conductor 14 has its upper end coupled, via a contact plug 25, to a metal interconnect layer 18 that functions as the bit line BL.

In a surface region of the well region 10, an $n^+$-type impurity diffusion layer 19 is formed. A contact plug 20 is formed above the diffusion layer 19, and is coupled to a metal interconnect layer 21 that functions as the source line SL. In the surface region of the well region 10, a $p^+$-type impurity diffusion layer 22 is also formed. A contact plug 23 is formed above the diffusion layer 22, and is coupled to a metal interconnect layer 24 that functions as a well interconnect CPWELL. The well interconnect CPWELL is used to apply a potential to the conductors 14 via the well region 10.

A plurality of configurations described above are arranged in the depth direction of the sheet of FIG. 2, and a group of the NAND strings 6 aligned in the depth direction forms one string unit SU.

The memory cell array 2 may have other configurations. That is, a configuration of the memory cell array 2 is described in, for example, U.S. patent application Ser. No. 12/407,403, entitled "THREE DIMENSIONAL STACKED NONVOLATILE SEMICONDUCTOR. MEMORY" filed on Mar. 19, 2009. Furthermore, a configuration of the memory cell array 2 is described in, for example, U.S. patent application Ser. No. 12/406,524, entitled "THREE DIMENSIONAL STACKED NONVOLATILE SEMICONDUCTOR MEMORY" filed on Mar. 18, 2009, U.S. patent application Ser. No. 12/679,991, entitled "NON-VOLATILE SEMICONDUCTOR STORAGE DEVICE AND METHOD OF MANUFACTURING THE SAME" filed on Mar. 25, 2010, and U.S. patent application Ser. No. 12/532, 030, entitled "SEMICONDUCTOR MEMORY AND METHOD FOR MANUFACTURING THE SAME" filed on Mar. 23, 2009. These patent applications are incorporated herein in their entirety by reference.

1.1.3 Configuration of Sense Amplifier

Next, a configuration of the sense amplifier 4 will be described with reference to FIG. 4.

1.1.3.1 Overall Configuration of Sense Amplifier

Figure 4:
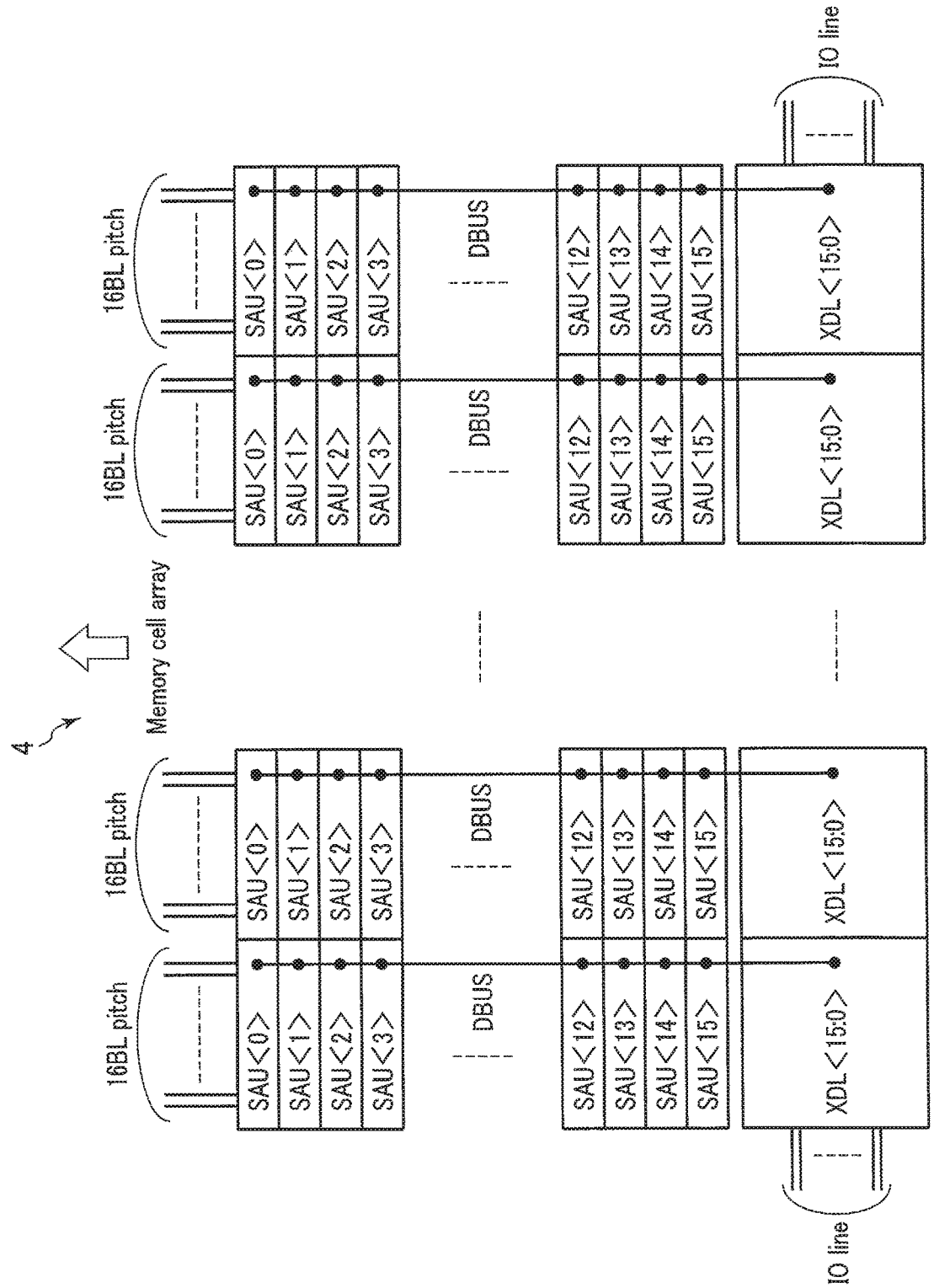
FIG. 4 is a block diagram of a sense amplifier included in the semiconductor memory device according to one embodiment.

As shown in FIG. 4, the sense amplifier 4 includes a plurality of sense amplifier units SAU and a plurality of latch circuits XDL.

For example, the sense amplifier units SAU are respectively provided for the bit lines BL. Each sense amplifier unit SAU senses data read out to a corresponding bit line BL and transfers write data to the corresponding bit line BL. For example, 16 sense amplifier units SAU are coupled to the same single bus DEUS. The number of the sense amplifier units SAU coupled to the same single bus DEUS is freely selected. In the description below, 16 sense amplifier units SAU coupled to the same single bus DEUS will be respectively expressed as SAU<0> to SAU<15> in order to distinguish between them.

The latch circuits XDL are respectively provided for the sense amplifier units SAU. Each latch circuit XDL temporarily stores data related to a corresponding bit line BL. A total of 16 latch circuits XDL<15:0>, which respectively correspond to the sense amplifier units SAU<0> to SAU<15>, are coupled to the same single bus DEUS. The respective latch circuits XDL are coupled to data lines TO. Each latch circuit XDL is used for data transmission and reception between a sense amplifier unit SAU and an exterior via a corresponding bus DBUS and a corresponding data line IO. Namely, data received from, for example, an external controller, etc. is stored in a latch circuit XDL via a corresponding data line IO, and is then transferred to a corresponding sense amplifier unit SAU via a corresponding bus DEUS, and vice versa.

1.1.3.2 Configuration of Sense Amplifier

Next, a configuration of the sense amplifier unit SAU will be described with reference to FIG. 5. The sense amplifier units SAU described as an example in the present embodiment take a current-sensing form which senses a current flowing through bit lines BL; however, the sense amplifier units SAU in a voltage-sensing form may be used.

Figure 5:
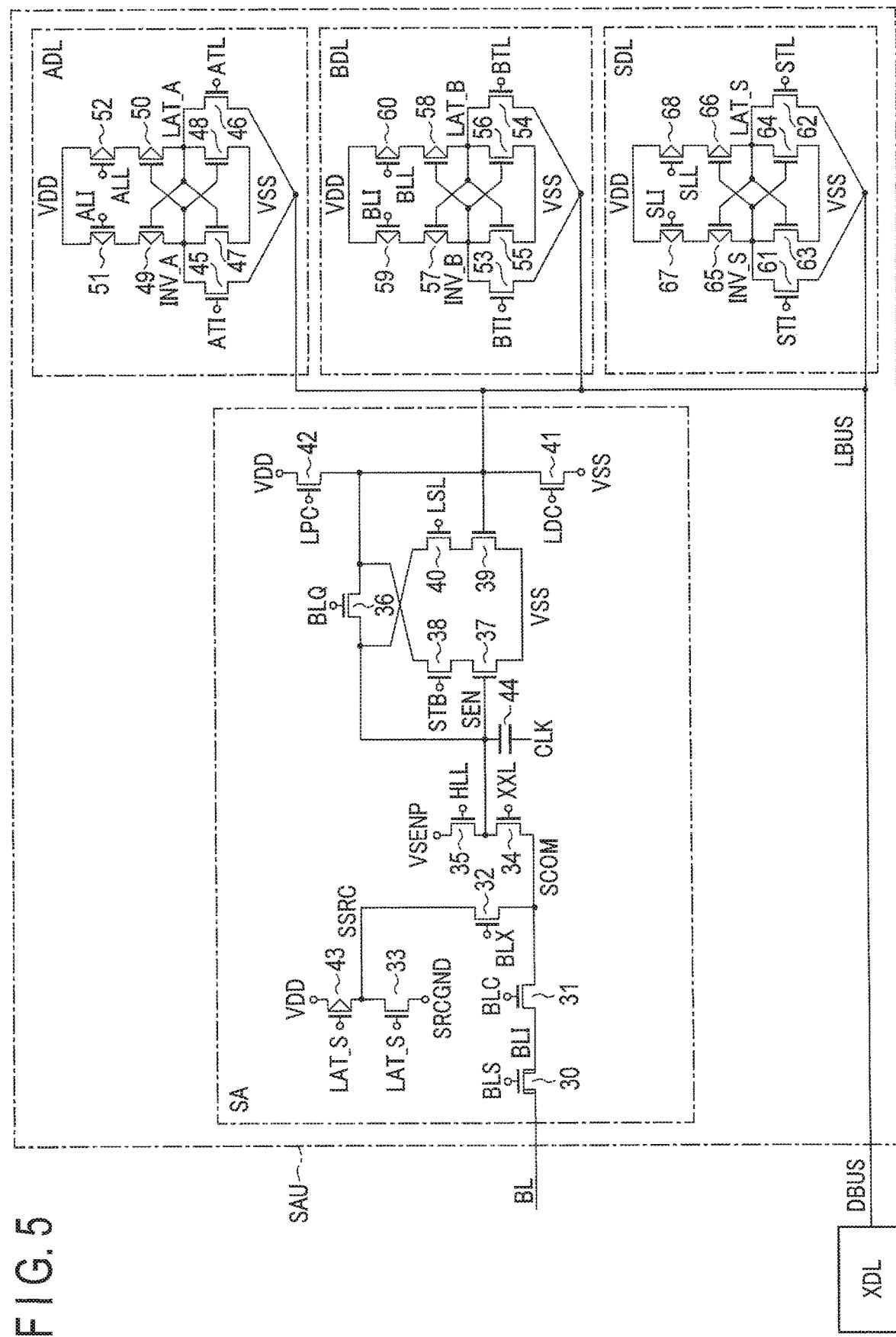
FIG. 5 is a circuit diagram of a sense amplifier unit included in the semiconductor memory device according to one embodiment.

As shown in FIG. 5, each of the sense amplifier units SAU includes a sense amplifier portion SA and, for example, three latch circuits SDL, ADL, and BDL, The sense amplifier portion SA and the latch circuits SDL, ADL, and BDL are coupled to each other via a bus LBUS.

The sense amplifier portion SA senses data read out to a corresponding bit line BL, and applies a voltage to the corresponding bit line BL in accordance with program data. That is, the sense amplifier portion SA is a module that directly controls the corresponding bit line BL. Furthermore, the sense amplifier portion SA is a module that performs AND operation or OR operation using data stored in the latch circuits SDL, ADL, and BDL.

Next, the sense amplifier portion SA will be described in terms of its circuit. Regarding a source and a drain of a transistor, hereinafter, one of them will be referred to as "one end of a current path" and the other will be referred to as "the other end of the current path".

As shown in FIG. 5, the sense amplifier portion SA includes a high voltage n-channel MOS transistor 30, low voltage n-channel MOS transistors 31 to 42, a low voltage p-channel MOS transistor 43, and a capacitor element 44.

The transistor 30 has a gate to which signal. BLS is input, and a current path having one end coupled to a corresponding bit line BL and the other end coupled to a node BLI. The transistor 31 has a gate to which signal BLC is input, and a current path having one end coupled to the node BLI and the other end coupled to a node SCOM. The transistor 31 is for clamping the corresponding bit line BL to a potential corresponding to the signal BLOC.

The transistor 32 has a gate to which signal BLX is input, and a current path having one end coupled to the node SCOM and the other end coupled to a node SSRC. The transistor 33 has a gate coupled to a node LAT_S to be described later, of the latch circuit SDL, and a current path having one end coupled to the node RC and the other end coupled to a node SRCGND. The node SRCGND receives, for example, application of a ground voltage VSS. The transistor 43 has a gate coupled to the node LAT_S to be described later, of the latch circuit SDL, and a current path having one end to which a power supply voltage VDD is applied, and the other end coupled to the node SSRC. The transistor 34 has a gate to which signal XXL is input, and a current path having one end coupled to the node SCOM and the other end coupled to a node SEN. The transistor 35 has a gate to which signal ELL is input, and a current path having one end to which voltage VSENP is applied and the other end coupled to the node SEN.

The capacitor element 44 has one electrode coupled to the node SEN and the other electrode to which a clock CLK is input.

The transistor 37 has a gate coupled to the node SEN, and a current path having one end coupled to one end of a current path of the transistor 38, and the other end grounded. The transistor 38 has a gate to which signal STB is input, and the current path having the other end coupled to the bus LBUS. The transistor 36 has a gate to which signal BLQ is input, and a current path having one end coupled to the node SEN and the other end coupled to the bus LBUS. The transistor 39 has a gate coupled to the bus LBUS, and a current path having one end coupled to one end of a current path of the transistor 40, and the other end grounded. The transistor 40 has a gate to which signal LSL is input, and the current path having the other end coupled to the node SEN.

The transistor 41 has a gate to which signal LDC is input, and a current path having one end coupled to the bus LBUS, and the other end grounded. The transistor 42 has a gate to which signal LPC is input, and a current path having one end coupled to the bus LBUS, and the other end to which the power supply voltage VDD is applied. The bus LBUS is pre-charged with voltage. VDD being transferred thereto by setting the transistor 42 to an ON state.

The latch circuit SDL, ADL, and BDL temporarily store data. In a data write operation, the sense amplifier portion SA controls a corresponding bit line BL according to data stored in the latch circuit SDL. The other latch circuits ADL and BDL are used to store data of each bit temporarily when the individual memory cell transistors store data composed of two or more bits, and the latch circuit SDL is also used in a similar way. The number of the latch circuits is freely selectable. For example, the number of the latch circuits is selected in accordance with the maximum amount of data (i.e., the number of bits) that can be stored in each memory cell transistor.

The latch circuit. SDL includes low voltage n-channel MOS transistors 61 to 64 and low voltage p-channel MOS transistors 65 to 68.

The transistor 61 has a gate to which signal STI is input, and a current path having one end coupled to the bus LBUS and the other end coupled to a node INV_S. The transistor 62 has a gate to which signal STL is input, and a current path having one end coupled to the bus LBUS and the other end coupled to a node LAT_S. The transistor 63 has a gate coupled to the node LAT_S, and a current path having one end grounded and the other end coupled to the node INV_S. The transistor 64 has a gate coupled to the node INV_S, and a current path having one end grounded and the other end coupled to the node LAT_S. The transistor 65 has a gate coupled to the node LAT_S, and a current path having one end coupled to the node INV_S. The transistor 66 has a gate coupled to the node INV_S, and a current path having one end coupled to the node LAT_S. The transistor 67 has a gate to which signal SLI is input, and a current path having one end coupled to the other end of the current path of the transistor 65, and the other end to which voltage VDD is applied. The transistor 68 has a gate to which signal SLL is input, and a current path having one end coupled to the other end of the current path of the transistor 66, and the other end to which the power supply voltage VDD is applied.

In the latch circuit SDL, the transistors 64 and 66 form a first inverter, while the transistors 63 and 65 form a second inverter. Output of the first inverter and input of the second inverter (node LAT_S) are coupled to the bus LBUS via the transistor 62 for data transfer, while input of the first inverter and output of the second inverter (node INV_S) are coupled to the bus LBUS via the transistor 61 for data transfer. The latch circuit SDL stores data in the node LAT_S, and stores its inversion data in the node INV_S.

Detailed description for the configurations of the latch circuits ADL and BDL will be omitted because they are similar to the configuration of the latch circuit SDL. However, their transistors and signals will be described under different reference numbers and names from those of the latch circuit SDL, as shown in FIG. 5. Namely, the transistors 45 to 52 in the latch circuit ADL and the transistors 53 to 60 in the latch circuit BDL respectively correspond to the transistors 61 to 68 in the latch circuit SDL. Signals ATI and BTI as well as signals ATL and BTL respectively correspond to signals STI and STL. Signals ALI and BLI as well as signals ALL and BLL respectively correspond to signals SLI and SLL. In each of the sense amplifier units SAU, the sense amplifier portion SA and the three latch circuits SDL, ADL, and BDL are coupled to each other via the bus LBUS in such a manner that data can be transmitted and received therebetween.

The bus LBUS is coupled to the bus DEUS via a bus switch (not shown). With this bus switch, the sense amplifier unit. SALT and the latch circuit XDL are coupled to each other.

In each of the sense amplifier units SAU configured as described above, various signals are provided by, for example, the control circuit 5.

1.2 Threshold Distribution of Memory Cell Transistor

Here, distributions of threshold voltages exhibited by the memory cell transistors MT according to the present embodiment will be described with reference to FIG. 6. In the present embodiment, the case in which one memory cell transistor MT can store up to octal data will be described; however, the maximum data per memory cell transistor MT is not limited to octal data. In the present embodiment, the memory cell transistor MT may be configured to store any data equal to or more than quaternary data (i.e., data composed of two bits or more).

Figure 6:
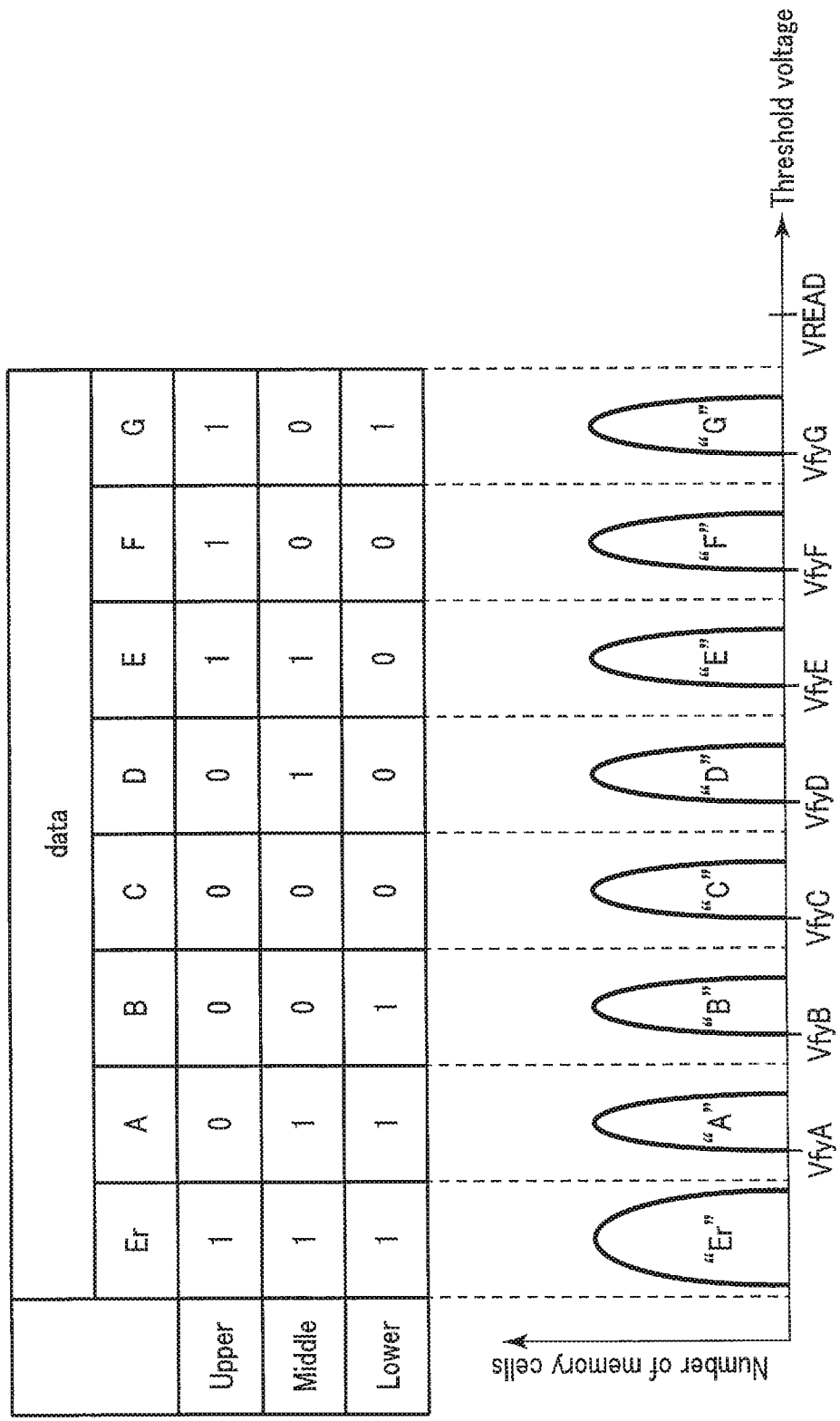
FIG. 6 shows threshold distributions of memory cell transistors included in the semiconductor memory device according to one embodiment.

FIG. 6 is a diagram showing data that the respective memory cell transistors MT can store, threshold distributions, and voltages used in a verify operation.

As shown in FIG. 6, each memory cell transistor MT may transition among eight states according to threshold voltages. Those eight states will be referred to as state "Er", state "A", state "B", state "C", . . . , and state "G" in ascending order of a threshold voltage.

In state "Er", the memory cell transistor MT has a threshold voltage lower than voltage VfyA, and state "Er" corresponds to a data-erased state. In state "A", the memory cell transistor MT has a threshold voltage equal to or higher than voltage VfyA and lower than VfyB (>VfyA). In state "B", the memory cell transistor MT has a threshold voltage equal to or higher than voltage VfyB and lower than VfyC (>VfyB). In state "C", the memory cell transistor MT has a threshold voltage equal to or higher than voltage VfyC and lower than VfyD (>VfyC). In state "D", the memory cell transistor MT has a threshold voltage equal to or higher than voltage VfyD and lower than VfyE (>VfyD). In state "E", the memory cell transistor MT has a threshold voltage equal to or higher than voltage VfyE and lower than VfyF (>VfyE). In state "F", the memory cell transistor MT has a threshold voltage equal to or higher than voltage VfyF and lower than VfyG (>VfyF). In state "G", the memory cell transistor MT has a threshold voltage equal to or higher than voltage VfyG and lower than voltage VREAD. Of the eight states distributed in this way, state "G" is the highest threshold voltage state. Note that voltage VREAD is to be applied to non-selected word lines in a verify operation, and it turns on the memory cell transistors MT regardless of data stored therein.

The states according to the respective threshold distributions described above are realized by writing three-bit (three-page) data constituted by the above-mentioned lower bit, middle bit, and upper bit. The relationship between the above eight states and the lower bit, middle bit, and upper bit is as follows:

State "Er": "111" (in the order of "upper/middle/lower")
State "A": "011"
State "B": "001"
State "C": "000"
State "D": "010"
State "E": "110"
State "F": "100"
State "G": "101"

Across the threshold distributions, the contents of data corresponding to one state differ from the contents of data corresponding to the neighboring state, in only one of the three bit values.

1.3 Write Operation

Next, a data write operation according to the present embodiment will be described. The write operation roughly includes a program operation and a verify operation.

The program operation refers to an operation of injecting electrons into the charge storage layer to increase a threshold voltage (or inhibiting the injection to maintain a threshold voltage). The operation of increasing the threshold voltage will be referred to as "program '0'". A bit line BL which is subject to the program "0" is provided with data "0". On the other hand, the operation of maintaining the threshold voltage will be referred to as "program '1'" or "write inhibit". A bit line BL which is subject to the program "1" is provided with data "1".

The verify operation reads data after the program operation, thereby judging whether or not a threshold voltage of a memory cell transistor MT has reached a target level. Writing to the memory cell transistor MT is inhibited after the memory cell transistor MT has reached the target level.

By increasing the threshold voltage of the memory cell transistor MT by repeating the combination of the program operation and the verify operation described above, the memory cell transistor MT is caused to transition to a target state.

1.3.1 Overall Flow of Write Operation

First, an overall flow of the write operation will be described with reference to FIG. 7. FIG. a flowchart showing the write operation. Hereinafter, the description will be given based on an exemplary case in which data is allocated as shown in FIG. 6.

Figure 7:
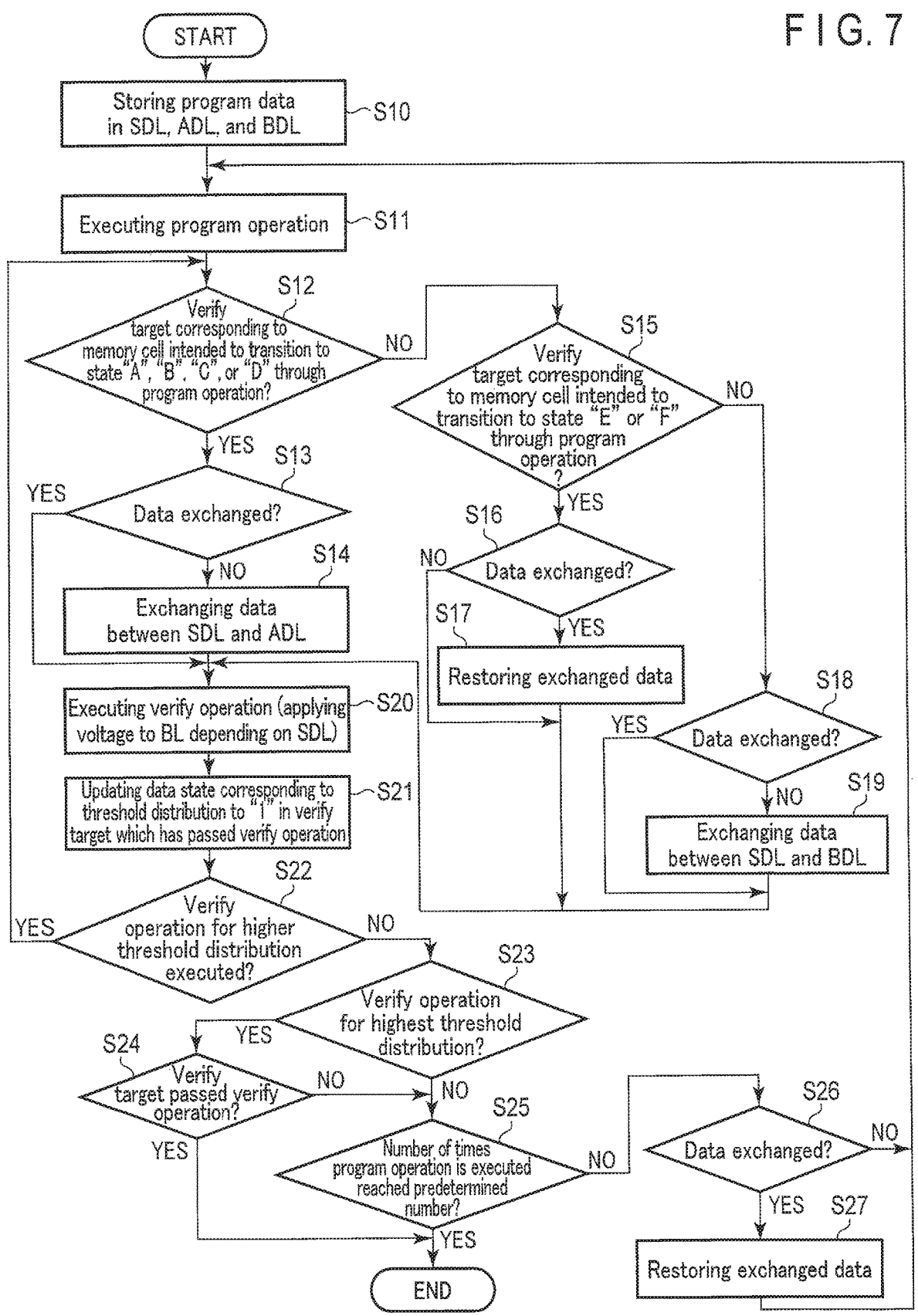
FIG. 7 is a flowchart showing a write operation of the semiconductor memory device according to one embodiment.

As shown in FIG. 7, first, the control circuit 5 stores program data received from an external controller in the latch circuits SDL, ADL, and BDL (step S10). More specifically, with respect to three-bit data to be written into a memory cell transistor MT, for example, the latch circuit SDL stores data of a lower bit, the latch circuit BDL stores data of a middle bit, and the latch circuit. ADL stores data of an upper bit.

Next, the sense amplifier unit SAU performs a predetermined arithmetic operation (e.g., AND operation) using data of the latch circuits SDL, ADL, and BDL, and executes a program operation in accordance with the arithmetic result (step S11). More specifically, if the arithmetic result is data "1", the program "1" is performed on a corresponding memory cell transistor MT. If the arithmetic result is data "0", the program "0" is performed thereon.

Next, the verify operation is performed. In performing the Verify operation, if a verify target is a memory cell intended to transition to state "A", "B", "C", or "D" through the program operation (Yes in step S12), the control circuit 5 determines whether or not data has been exchanged between the latch circuit SDL and the latch circuit ADL or BDL (step S13). For example, the control circuit 5 stores information (such as a flag, etc.) indicative of whether or not data has been exchanged.

If data has not been exchanged yet (step S13, No), the control circuit 5 exchanges data between the latch circuit SDL and the latch circuit ADL (step S14). The information indicative of which two of the latch circuits have exchanged data is stored in, for example, the control circuit 5. Next, in step S20, the control circuit 5 executes a verify operation to be described later. On the other hand, if data has already been exchanged (Yes in step 13), the control circuit 5 executes the verify operation to be described later in step S20.

If the verify target is a memory cell intended to transition to state "E" or "F" through the program operation (No in step S12 and Yes in Step 15), the control circuit 5 determines whether or not data has been exchanged between the latch circuit SDL and the latch circuit ADL or BDL (step S16).

If data has already been exchanged (Yes in step S16), the control circuit 5 restores data exchanged between the latch circuit SDL and the latch circuit ADL (step 17). Next, the control circuit 5 executes the verify operation to be described later in step S20. On the other hand, if data has not been exchanged yet (No in step S16), the control circuit 5 executes the verify operation to be described later in step S20.

If the verify target is a memory cell intended to transition to state "G" through the program operation (No in step S12 and No in Step 15), the control circuit 5 determines whether or not data has been exchanged between the latch circuit SDL and the latch circuit ADL or BDL (step S18).

If data has not been exchanged yet (No in step S18), the control circuit 5 exchanges data between the latch circuit SDL and the latch circuit BDL (step S19) Next, the control circuit 5 executes the verify operation to be described later in step S20. On the other hand, if data has already been exchanged (Yes in step S18), the control circuit 5 executes the verify operation to be described later in step S20.

Next, the control circuit 5 executes the verify operation (step S20). That is, bit lines BL corresponding to the latch circuits SDL which each store data "0" are pre-charged, and at least any one of the pre-charged bit lines BL corresponds to the verify target. On the other hand, the sense amplifier portion SA applies, e.g., voltage VSS (for example, 0 V) to bit lines BL corresponding to the latch circuits SDL which each store data "1", and maintains voltages of these bit lines BL at voltage VSS during the verify operation. Note that pre-charge voltage VPCH is higher than voltage VSS, for example.

Next, the control circuit 5 updates data, which is stored in the latch circuits SDL, ADL, and BDL each corresponding to a bit line BL coupled to a memory cell transistor MT which has passed the verify operation, to data "1" (step S21). More specifically, for example, data "0" in each of the latch circuits SDL, ADL, and BDL is updated to data "1", whereas data "1" is maintained without change.

If the verify operation with respect to higher threshold distributions is executed continuously (Yes in step S22), in step S12, the control circuit 5 determines again whether or not the verify target is a memory cell intended to transition to state "A", "B", "C", or "D" through the program operation.

If the verify operation with respect to higher threshold distributions is not executed continuously (No in step S22), the control circuit 5 determines again whether to terminate the write operation or to execute the program operation again in step S11.

Specifically, when the executed verify operation corresponds to the verify operation with respect to the highest threshold distribution (for example, state "G") (Yes in step S23), the write operation is terminated if the memory cell transistor MT has passed the executed verify operation (Yes in step S24).

When the executed verify operation does not correspond to the verify operation with respect to the highest threshold distribution (No in step S23), or even if it does, when the memory cell transistor MT fails the executed verify operation (Yes in step S23 and No in step S24), the control circuit 5 determines whether or not the number of times the program operation is executed has reached a predetermined number (step S25). If the number of times the program operation is executed has reached the predetermined number (Yes in step S25), the control circuit 5 terminates the write operation.

If the number of times the program operation is executed has not reached the predetermined number (No in step S25), the control circuit 5 determines whether or not data has been exchanged between the latch circuit SDL and the latch circuit ADL or BDL (step S26).

If data has already been exchanged (Yes in step S26), the control circuit 5 restores data exchanged between the latch circuit SDL and the latch circuit ADL or BDL (step 27). Thereafter, the control circuit 5 executes the program operation again in step S11 (step S11). On the other hand, if data has not been exchanged yet (No in step S26), the control circuit 5 executes the program operation again in step S11 (step S11).

1.3.2 Details of Verify Operation.

Next, the verify operation according to the present embodiment will be described.

1.3.2.1 Data Exchange Operation and Data Restore Operation.

First, a concept of a data exchange operation will be briefly described with reference to FIGS. 8A to 8D. FIGS. 8A to 8D are conceptual diagrams each showing the data exchange operation.

The data exchange operation according to the present embodiment is an operation to exchange data between two latch circuits corresponding to the same bit line BL, and is performed in order to limit bit lines BL to which pre-charge voltage is applied. On the other hand, a data restore operation is an operation to restore data exchanged in the data exchange operation, and is performed for the program operation. Hereinafter, an exemplary case in which data is exchanged between the latch circuit SDL and the latch circuit ADL will be described.

Figure 8A:
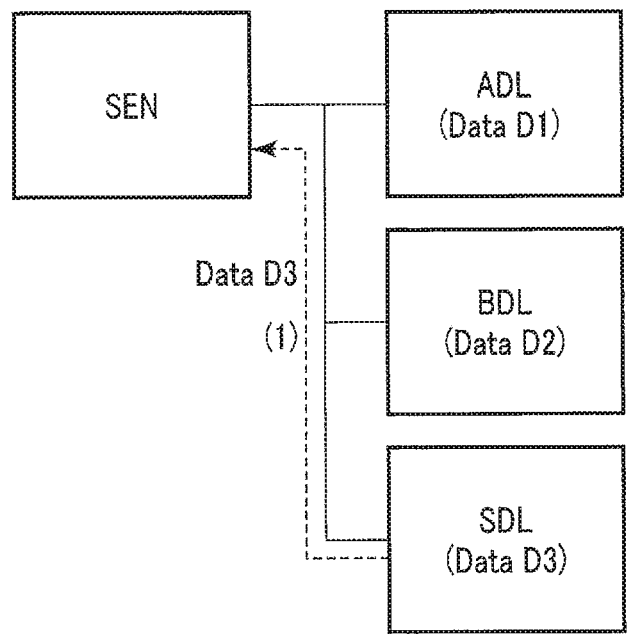
FIGS. 8A to 8D are conceptual diagrams each showing a data exchange operation of the semiconductor memory device according to one embodiment.
Figure 8B:
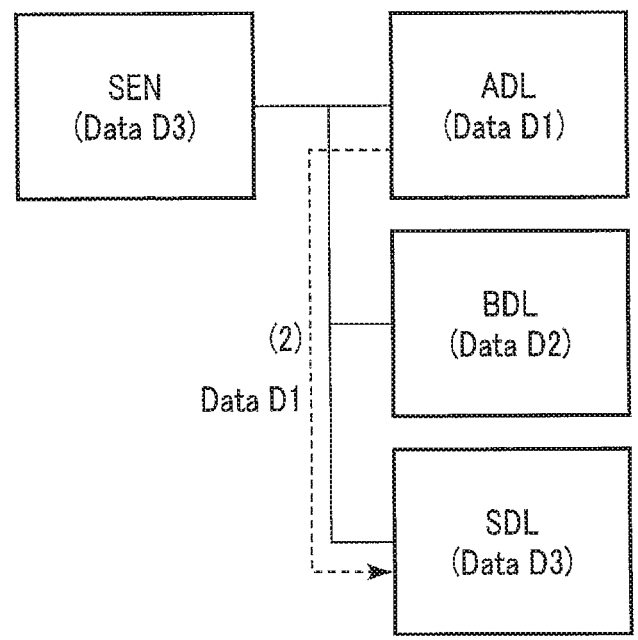
Figure 8C:
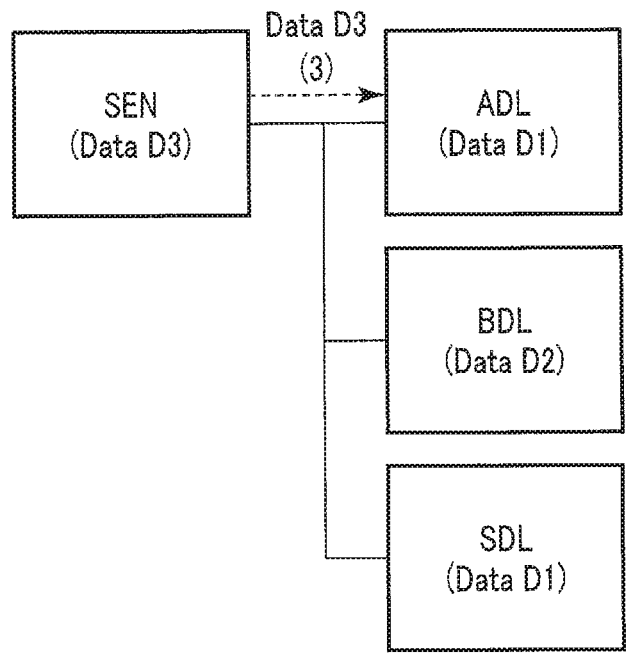
Figure 8D:
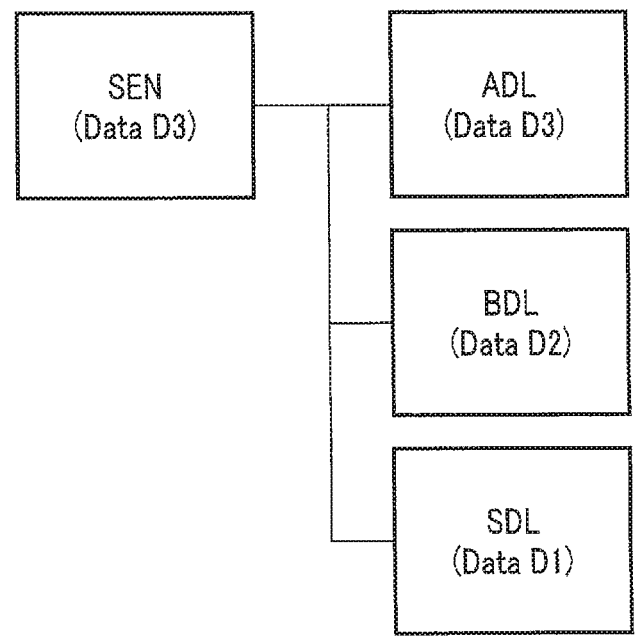

First, as shown in FIG. 8A, data D3 stored in the latch circuit SDL is transferred to the node SEN. Second, as shown in FIG. 8B, data D1 stored in the latch circuit ADL is transferred to the latch circuit SDL. Subsequently, as shown in FIG. 8D, data D3 stored in the node SEN is transferred to the latch circuit ADL. Accordingly, as shown in FIG. 8D, data D3 is stored in the latch circuit ADL, and data D1 is stored in the latch circuit SDL. In this manner, exchange of data is completed.

Next, with reference to FIGS. 9 to 9F and 10, the aforementioned data exchange operation will be described in detail. FIGS. 9A to 9F are each a circuit diagram of partial region of the sense amplifier during the data exchange operation. FIG. 10 is a timing chart showing voltages of interconnects during the data exchange operation.

Figure 9A:
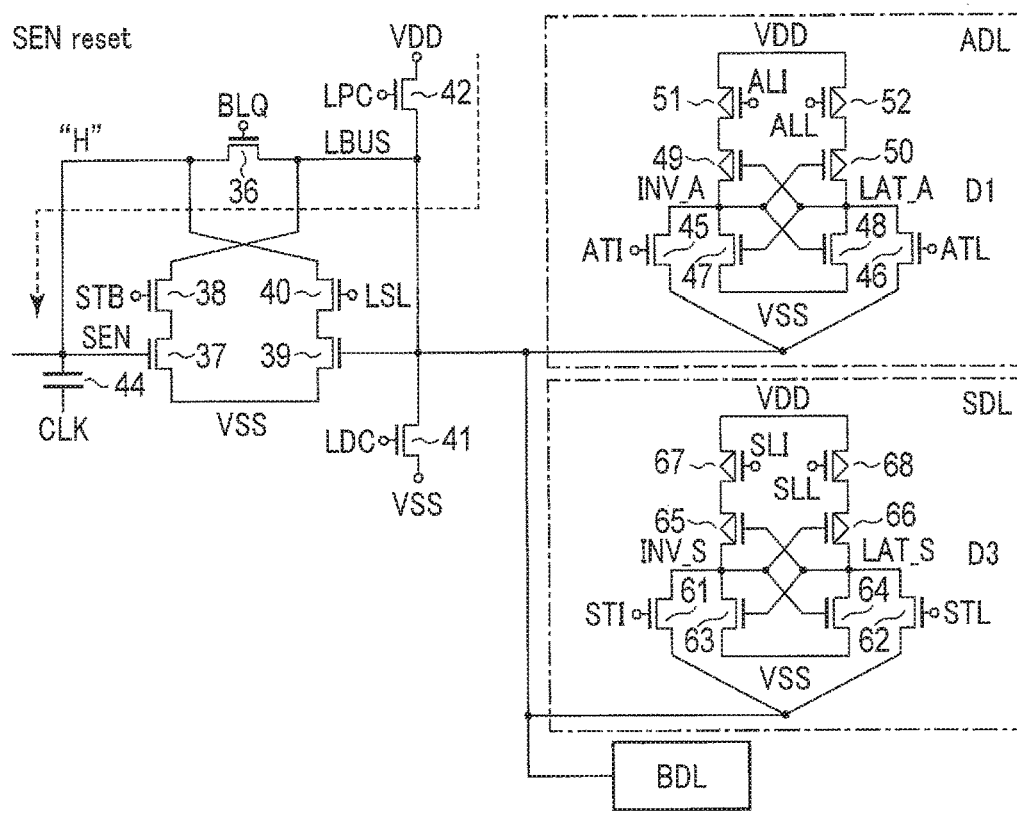
FIGS. 9A to 9F are diagrams illustrating in detail the data exchange operation of the semiconductor memory device according to one embodiment.
Figure 10:
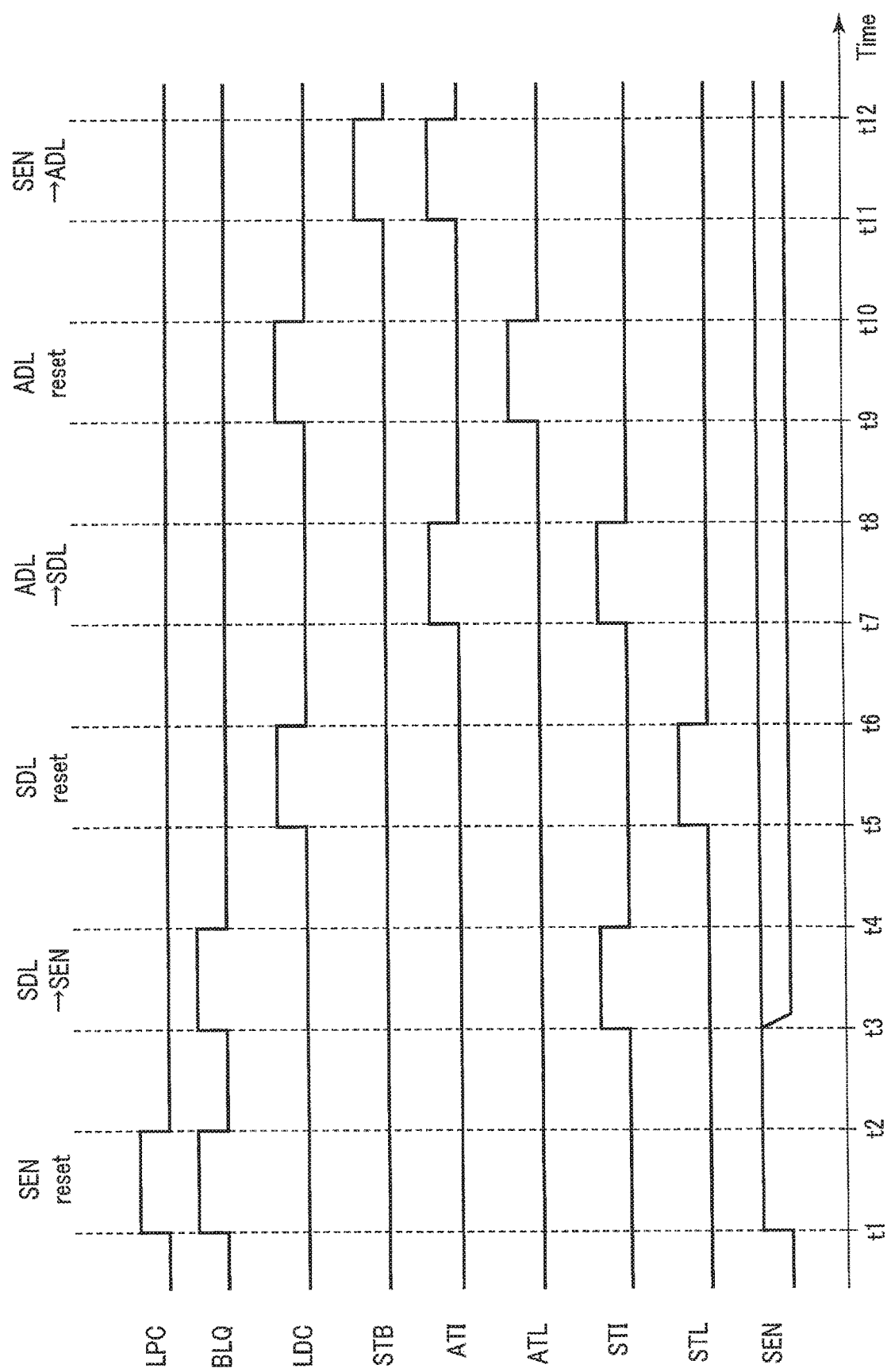
FIG. 10 is a timing chart showing voltages of interconnects in the data exchange operation of the semiconductor memory device according to one embodiment.

First, as shown in FIG. 9A, the node SEN is reset. Specifically, as shown in FIG. 10, the control circuit 5 sets signals LPC and BLQ to level "H" at time t1. In this manner, the transistors 42 and 36 are set to an ON state, and the node SEN is charged to level "H". At time t2, the control circuit 5 sets signals LPC and BLQ to level "L". In this manner, the transistors 42 and 36 are set to an OFF state, and the node SEN is maintained at level "H".

Figure 9B:
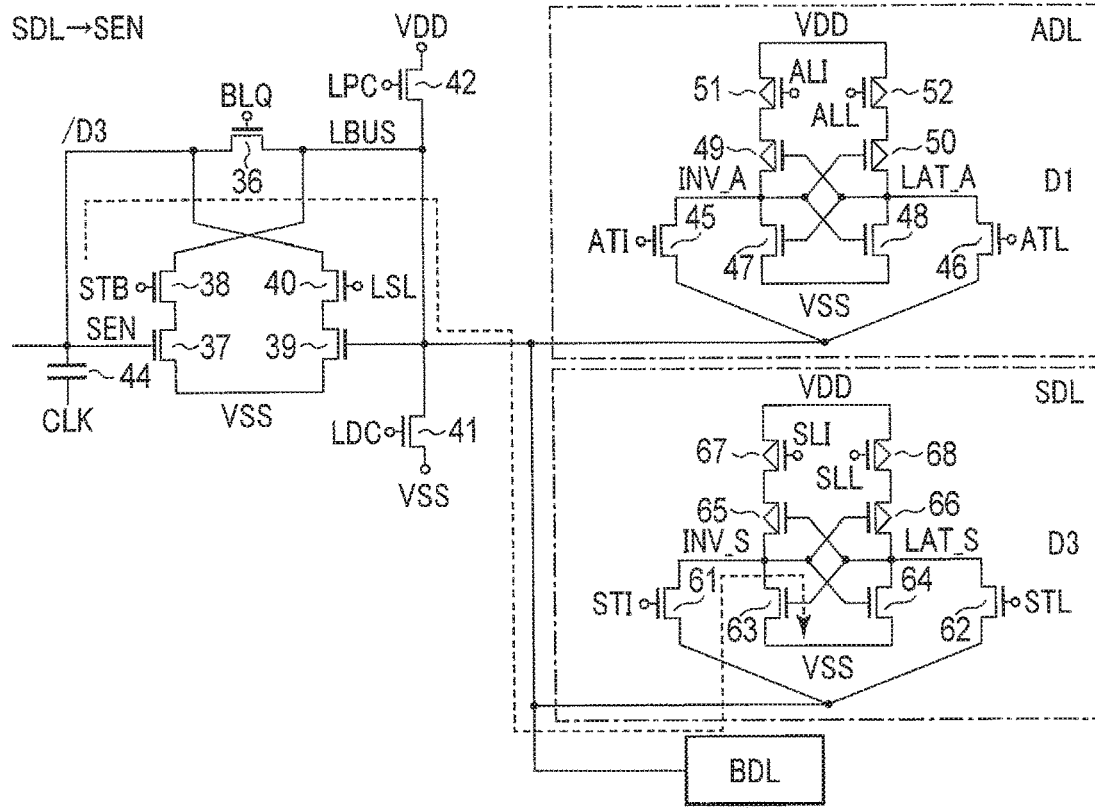

Next, as shown in FIG. 9B, data stored in the latch circuit SDL is transferred to the node SEN. Specifically, as shown in FIG. 10, the control circuit 5 sets signals BLQ and STI to level "H" at time t3. In this manner, the transistors 36 and 61 are set to an ON state, and data "/D3" stored in the node INV_S of the latch circuit SDL is transferred to the node SEN. Herein, "/" means inversion. At this time, the node SEN transitions to level "L" in the case of data "D3" being level "H", and transitions to level "H" in the case of data "D3" being level "L". At time t4, the control circuit 5 sets signals BLQ and STI to level "L". In this manner, the transistors 36 and 61 are set to an OFF state, and data "/D3" is maintained in the node SEN.

Figure 9C:
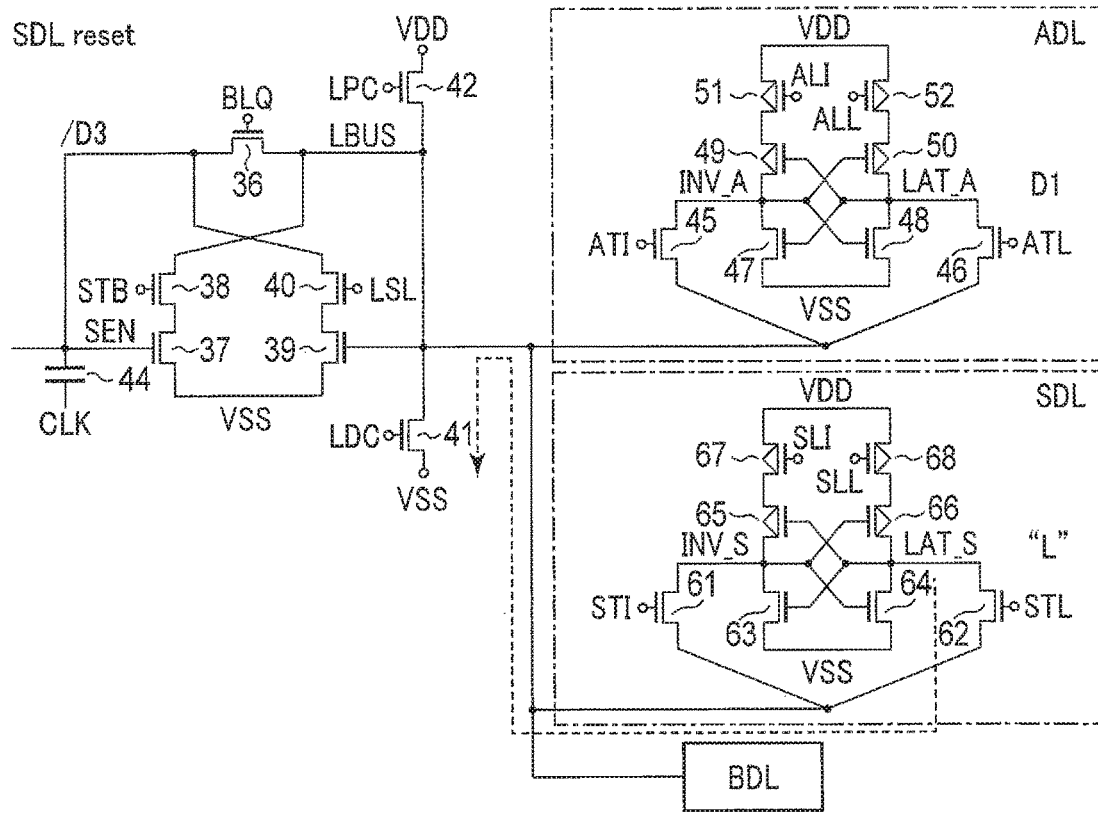

Next, as shown in FIG. 9C, the latch circuit SDL is reset. Specifically, as shown in FIG. 10, the control circuit 5 sets signals LDC and STL to level "H" at time t5. In this manner, the transistors 41 and 62 are set to an ON state, and the node LAT_S of the latch circuit SDL transitions to level "L". At time t6, the control circuit 5 sets signals LDC and STL to level "L". In this manner, the transistors 41 and 62 are set to an OFF state, and the node LAT_S of the latch circuit SDL is maintained at level "L".

Figure 9D:
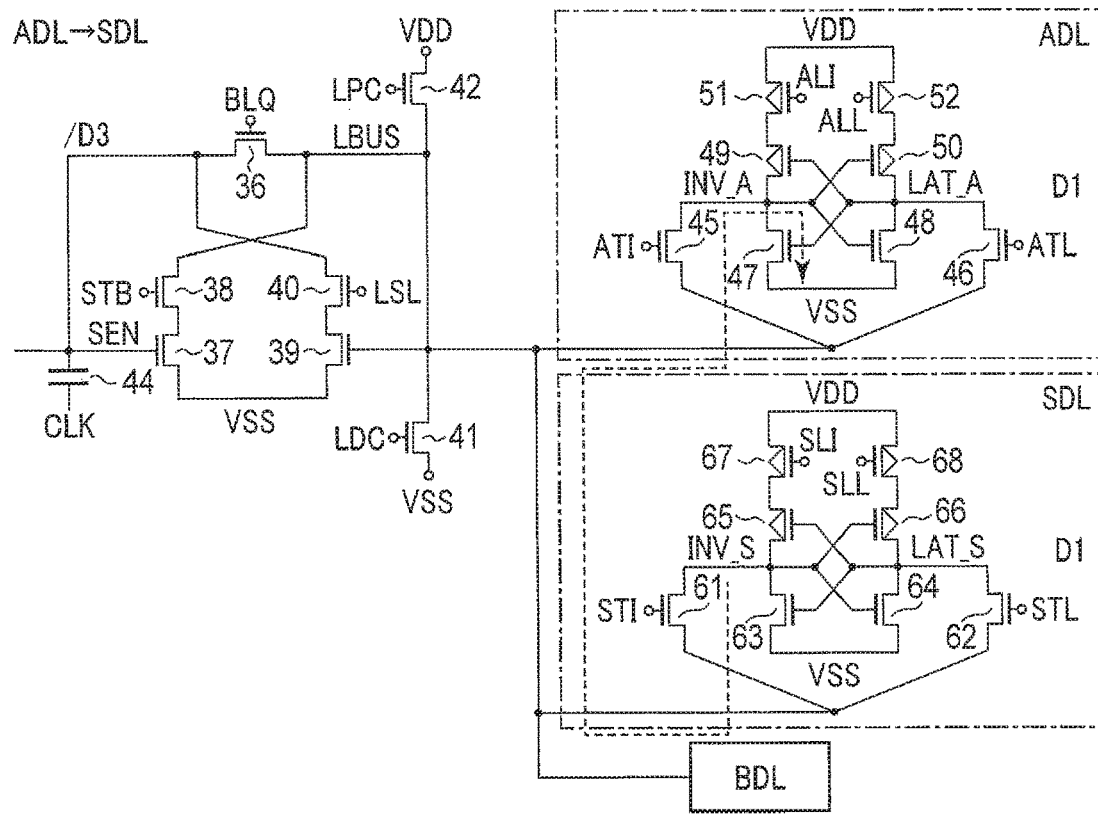

Next, as shown in FIG. 9D, data stored in the circuit ADL is transferred to the latch circuit SDL. Specifically, as, shown in FIG. 10, the control circuit sets signals ATI and STI to level "H" at time t7. In this manner, the transistors 45 and 61 are set to an ON state, and data "/D1" stored in the node INV_A of the latch circuit ADL is transferred to the node INV_S of the latch circuit SDL. At time t3, the control circuit 5 sets signals ATI and STI to level "L". In this manner, the transistors 45 and 61 are set to an OFF state, and data "D1" is maintained in the node LAT_S of the latch circuit SDL.

Figure 9E:
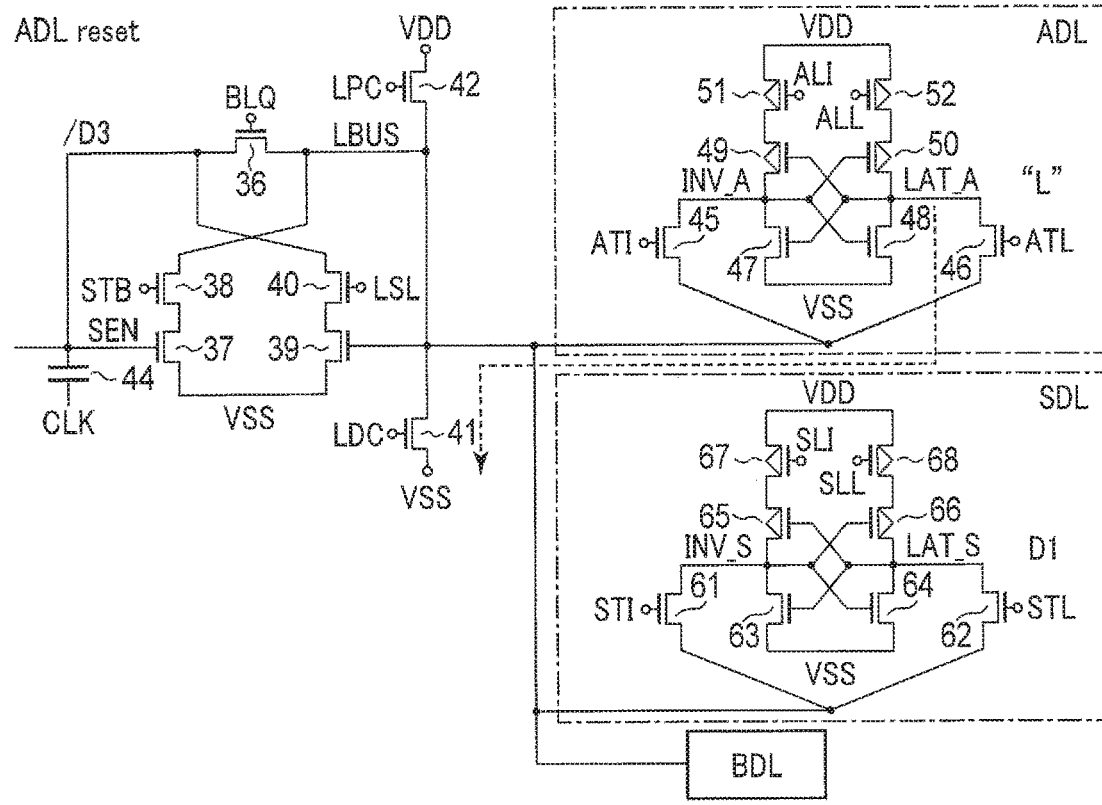
Figure 9F:
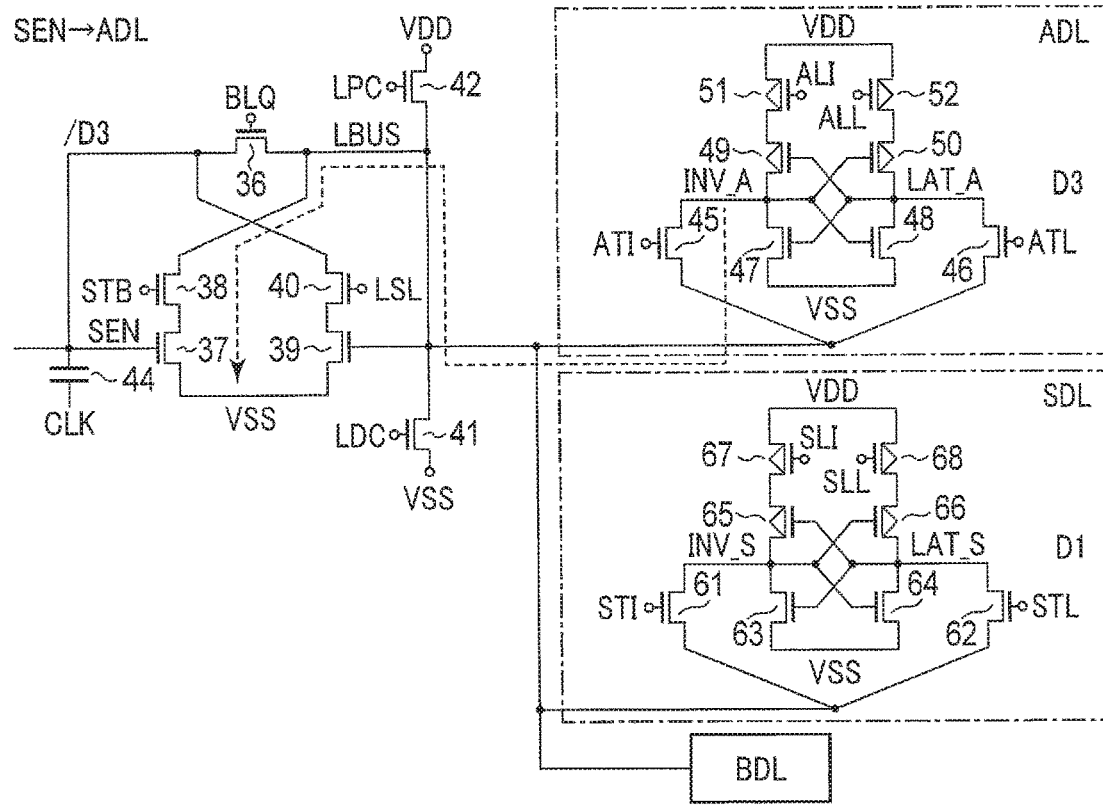

Next, as shown in FIG. 9E, the latch circuit ADL is reset. Specifically, as shown in FIG. 10, the control circuit 5 sets signals LDC and ATL to level "H" at time t9. In this manner, the transistors 41 and 46 are set to an ON state, and the node LAT_A. of the latch circuit ADL transitions to level "L". At time t10, the control circuit 5 sets signals LDC and ATL to level "L". In this manner, the transistors 41 and 46 are set to an OFF state, and the node LAT_A of the latch circuit. ADL is maintained at level "L".

Lastly, as shown in FIG. 9F, data stored in the node SEN is transferred to the latch circuit ADL. Specifically, as shown in FIG. 10, the control circuit sets signals STB and ATI to level "H" at time t11. At this time, the node INV_A of the latch circuit ADL transitions to level "L" in the case of data "/D3" in the node SEN being level "H", and maintains at level "H" in the case of data "/D3 being level "L". In this manner, the transistors 38 and 45 are set to an ON state, and data "/D3" in the node SEN is transferred to the node LAT_A of the latch circuit ADL. At time t12, the control circuit 5 sets signals STB and ATI to level "L". In this manner, the transistors 38 and 45 are set to an OFF state, and data "D3" is maintained in the node LAT_A of the latch circuit ADL.

Next, the aforementioned data restore operation will be described. The data restore operation is the same operation as the data exchange operation described above, except that the data restore operation is performed after data is exchanged. In the data exchange operation shown in FIGS. 9A to 9F, data "D3" stored in the latch circuit SDL is transferred to the latch circuit ADL, and data "D1" stored in the latch circuit ADL is transferred to the latch circuit SDL. Hereinafter, the description will be given based on an exemplary case in which the data restore operation is performed after the operation shown in FIG. 9F.

First, as in FIG. 9A, the node SEN is charged to level "H". Next, as in FIG. 9B, data "/D1" stored in the node INV_S of the latch circuit SDL is transferred to the node SEN. As in FIG. 9C, the latch circuit SDL is then reset, and the node LAT_S transitions to level "L". As in FIG. 9D, data "/D3" stored in the node INV_A of the latch circuit ADL is transferred to the node INV_S of the latch circuit SDL. As in FIG. 9E, the latch circuit ADL is reset, and the node LAT_A transitions to level "L". Lastly, as in FIG. 9F, data "/D1" stored in the node SEN is transferred to the node LAT_A of the latch circuit ADL. Through the operations described above, data "D1" transferred from the latch circuit ADL to the latch circuit SDL is restored to the latch circuit ADL, while data "D3" transferred from the latch circuit SDL to the latch circuit ADL is restored to the latch circuit SDL.

1.3.2.2 Voltages of Interconnects in Verify Operation

Figure 11:
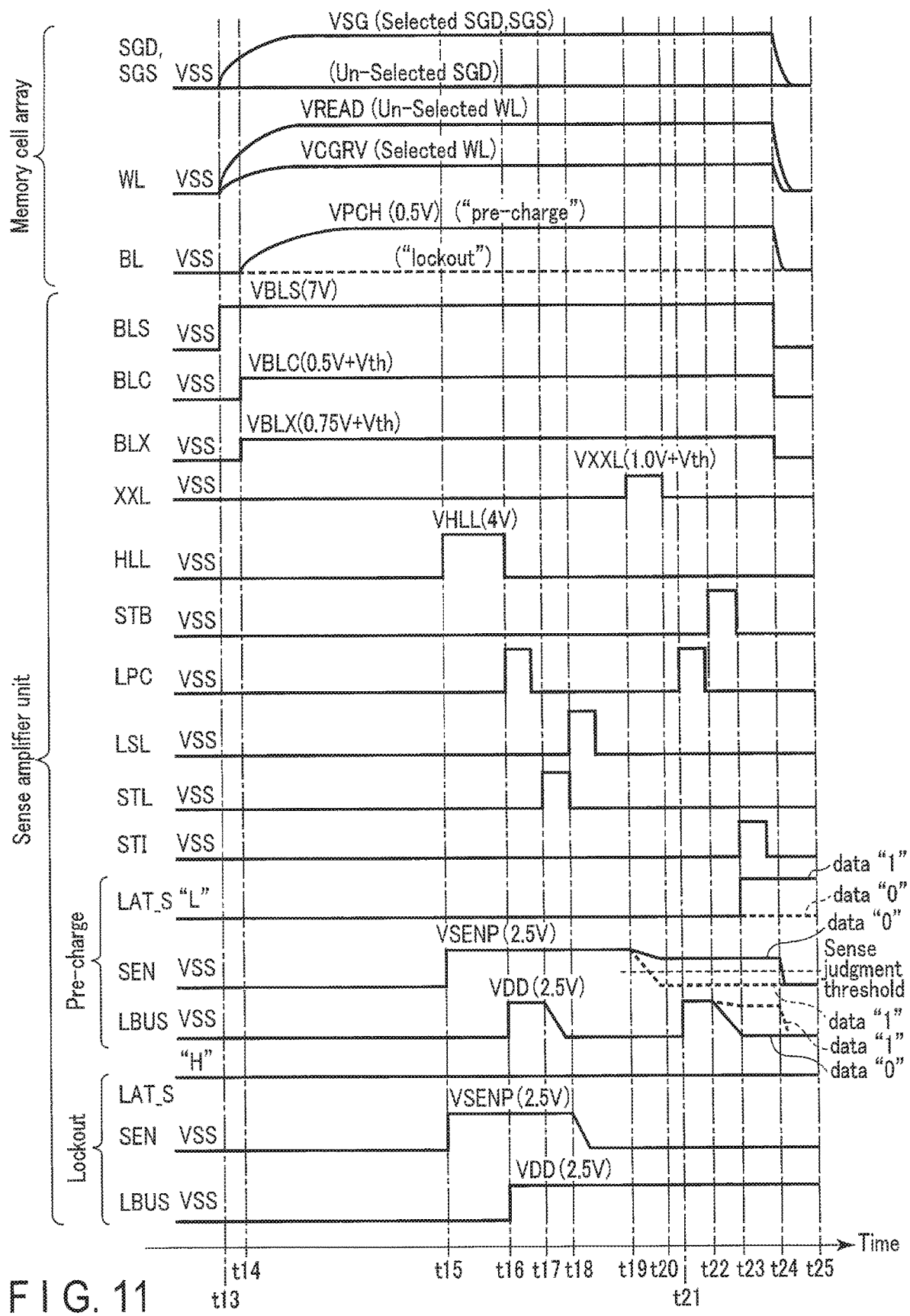
FIG. 11 is a timing chart showing voltages of interconnects in a verify operation of the semiconductor memory device according to one embodiment.

Next, voltages of interconnects during the verify operation will be described with reference to FIG. 11. FIG. 11 is a timing chart showing voltages of interconnects in the memory cell array 2 and each sense amplifier unit SAU during the verify operation.

At time t13, as shown in FIG. 11, a row decoder 3 applies voltage VSG to the select gate lines SGD and SGS corresponding to a memory cell transistor MT which is subject to the program operation, thereby setting the select transistors ST1 and ST2 to an ON state. Voltage VSS is applied to the select gate lines SDG and SGS corresponding to a memory cell transistor MT which is not subject to the program operation. The row decoder 3 applies voltage VCGRV to a selected word line WL, and voltage VREAD to non-selected word lines WL. Voltage VCGRV is a voltage that is set during the verify operation in accordance with a threshold voltage of a memory cell transistor MT as a verify target, and is expressed as VREAD>VCGRV.

At this time, as shown in FIG. 11, the control circuit 5 sets signal BLS to level "H" in the sense amplifier unit SAU. That is, the transistor 30 transitions to an ON state by applying voltage VBLS (for example, 7 V) to its gate, thereby coupling the sense amplifier unit SAU to a corresponding bit line BL.

At time t14, as shown in FIG. 11, the control circuit 5 sets signals BLC and BLX level "H." in the sense amplifier unit SAU. That is, the transistor 31 transitions to an ON state by applying voltage VBLC (for example, 0.5 V+Vth) to its gate.

Voltage Vth is a threshold voltage of a low n-channel MOS transistor within the sense amplifier unit SAU. Similarly, the transistor 32 transitions to an ON state by applying voltage VBLX (for example, 0.75 V+Vth) to its gate. A relation between voltages VBLX and VBLC is expressed as VBLX≥VBLC.

At this time, in the sense amplifier portion SA in which data "0" is stored in the latch circuit SDL, the transistor 43 transitions to an ON state and the transistor 33 transitions to an OFF state, thereby allowing voltage VDD to be applied to the transistor 32. Therefore, as indicated by the solid line in FIG. 11, pre-charge voltage VPCH (for example, 0.5 V) clamped by the transistor 31 is applied to a bit line BL which is subject to pre-charge. Cell current Icell flows from the bit line BL side toward the Source line SL side in accordance with threshold voltage Vtc of a memory cell transistor MT as a verify target. More specifically, when the memory cell transistor MT is in an ON state with threshold voltage Vtc being lower than voltage VCGRV, that is, when the program operation has not been completed, cell current Icell flows through a corresponding sense amplifier unit SAU. In contrast, when the memory cell transistor MT is in an OFF state with threshold voltage Vtc being higher than voltage VCGRV, that is, when the program operation has been completed, the memory cell transistor MT transitions to an OFF state, so that cell current Icell does not flow through the corresponding sense amplifier unit SAU.

On the other hand, in the sense amplifier portion SA in which data "1" is stored in the latch circuit SDL, the transistor 43 transitions to an OFF state and the transistor 33 transitions to an ON state, thereby allowing voltage VSS, for example, to be applied to the transistor 32 via the node SRCGND. Therefore, as indicated by the broken line in FIG. 11, a bit line BL corresponding to the sense amplifier unit SAU concerned is not subject to pre-charge, thereby receiving application of voltage VSS, for example.

At time t15, as shown in FIG. 11, the control circuit 5 sets signal HLL to level "H". More specifically, the control circuit 5 applies voltage VHLL (for example, 4 V) to a gate of the transistor 35, thereby setting the transistor 35 to an ON state. In this manner, voltage VSENP (for example, 2.5 V) is applied to the node SEN. After charging of the node SEN is completed, the control circuit 5 sets signal HLL to level "L", thereby setting the transistor 5 to an OFF state.

At time t16, as shown in FIG. 11, the control circuit 5 sets signal LPC to level "H", thereby setting the transistor 42 to an ON state. In this manner, voltage VDD (for example, 2.5 V) is applied to the bus LBUS. After charging of the bus LBUS is completed, the control circuit 5 sets signal LPC to level "L", thereby setting the transistor 42 to an OFF state.

At time t17, as shown in FIG. 11, the control circuit 5 sets signal STL to level "H", thereby setting the transistor 62 to an ON state in the latch circuit SDL.

In this manner, the bus LBUS transitions to level "H" in a sense amplifier unit SAU having data "1" stored in the latch circuit SDL, that is, the sense amplifier unit SAU coupled to a bit line BL to which pre-charge voltage VPCH is not applied. On the other hand, the bus LBUS transitions to level "L" in a sense amplifier unit SAU having data. "0" stored in the latch circuit SDL, that is, the sense amplifier unit SAU coupled to a bit line BL to which pre-charge voltage VPCH is applied.

At time t18, as shown in FIG. 11, the control circuit 5 sets the transistor 40 to an ON state by setting signal. LSL to level "H". With the bus LBUS being in level "L", the transistor 39 transitions to an OFF state. Therefore, in a sense amplifier unit SAU corresponding to a memory cell transistor MT of a verify target, the node SEN maintains level "H", that is, voltage VSENP (2.5 V), as shown in FIG. 11. On the other hand, with the bus LBUS being in level "H", the transistor 39 transitions to an ON state. Thus, in a sense amplifier unit SAU which does not correspond to the memory cell transistor MT of the verify target, the node SEN transitions to level "L".

At time t19, as shown in FIG. 11, the control circuit 5 sets signal XXL to level "H". That is, the control circuit 5 sets the transistor 34 to an ON state by applying voltage VXXL (for example, 1.0 V+Vth) to its gate. As a result, in the sense amplifier unit SAU corresponding to the memory cell transistor MT of the verify target, a voltage (for example, 1 V) clamped by the transistor 31 is applied from the node SEN to the node SCOM. In the sense amplifier unit SAU which does not correspond to the memory cell transistor MT of the verify target, the node SEN has level "L", so that no voltage is applied.

At, this time, if the memory cell transistor MT as the verify target is in an ON state, the sense amplifier unit SAU corresponding to the memory cell transistor MT of this verify target has cell current Icell flowing from the sense amplifier unit SAU to a bit line BL which is subject to pre-charge. For this reason, the node SEN significantly decreases in voltage, as shown in FIG. 11. On the other hand, if the memory cell transistor MT as the verify target is an ON state, cell current Icell flows very little from the sense amplifier unit SAU to the bit line BL which is subject to pre-charge. Accordingly, the node SEN decreases very little in voltage.

At time t20, as shown in FIG. 11, the control circuit 5 sets signal XXL to level "L", thereby setting the transistor 34 to an OFF state.

At time t21, as shown in FIG. 11, the control circuit 5 sets signal LPC to level "H", thereby setting the transistor 42 to an ON state. In this manner, voltage VDD (for example, 2.5 V) is applied to the bus LBUS. After charging of the bus LBUS is completed, the control circuit sets signal LPC to level "L", thereby setting the transistor 42 to an OFF state.

At time t22, as shown in FIG. 11, the control circuit sets signal STB to level "H", thereby setting the transistor 38 to an ON state.

In the sense amplifier unit SAU corresponding to the memory cell transistor MT of the verify target with the node SEN being lower in voltage than a sense judgment threshold, i.e., a threshold voltage of the transistor 37, the transistor 37 transitions to an OFF state. Thus, the bus LBUS decreases very little in voltage, as shown in FIG. 11. As a result, data "1" is stored in the bus LBUS. On the other hand, with the node SEN being higher in voltage than the sense judgment threshold, the transistor 37 transitions to an ON state. Accordingly, the bus LBUS significantly decreases in voltage. As a result, data "0" is stored in the bus LBUS. Furthermore, in the sense amplifier unit SAU which does not correspond to the memory cell transistor MT of the verify target, the node SEN has level "L", so that the transistor 37 transitions to an OFF state. Therefore, data "1" is stored in the bus LBUS.

That is, assume that a corresponding memory cell transistor MT is the verify target. In this case, as shown in FIG. 11, if the corresponding memory cell transistor MT has passed the verify operation, data "0" is stored in the bus LBUS. If the corresponding memory cell transistor MT has failed the verify operation, data "1" is stored in the bus LBUS. Furthermore, in the case where the corresponding memory cell transistor MT is not the verify target, data "1" is stored in the bus LBUS.

At time t23, as shown in FIG. 11, the control circuit 5 sets signal STB to level "L", thereby setting the transistor 38 to an OFF state. The control circuit 5 transfers data stored in the bus LBUS to the latch circuit SDL.

For example, as shown in FIG. 11, the control circuit 5 sets the transistor 67 to an OFF state by setting signal SLI to level "H", and sets the transistor 61 to an ON state by setting signal STI to level "H" in the latch circuit SDL. In this manner, data stored in the bus LBUS is loaded in the node INV_S. That is, data "1" is stored in the latch circuit SDL of the sense amplifier unit SAU corresponding to the memory cell transistor MT which has passed the verify operation. On the other hand, the latch circuit SDL of the sense amplifier unit SAU corresponding to the memory cell transistor MT which has failed the verify operation maintains data "0", and the latch circuit SDL of the sense amplifier unit SAU which does not correspond to the memory cell transistor MT the verify target maintains data "1".

At times t24 and t25, a recovery operation is performed, thereby terminating the verify operation. Specifically, at time t24, as shown in FIG. 11, the control circuit 5 sets signals BLS, BLC, and BLX to level "L", thereby setting the transistors 30 to 32 to an OFF state.

The above verify operation is applicable to the data read operation.

1.3.3 Specific Example of Write Operation

The write operation according to the present Embodiment will be described in more detail. FIG. 12 is a diagram showing a relation between the number of times the write operation is performed, and a state according to each threshold distribution exhibited by a target of the verify operation performed every time the write operation is performed. FIG. 12 shows an exemplary case in which data is written by repeating the combination of the program operation and the verify operation 19 times. Hereinafter, the combination of one program operation and one or more verify operations subsequent to the program operation will be referred to as a "loop".

FIG. 12 shows target states for the verify operation performed in each of the loops. As shown in FIG. 12, the first and second loops perform the verify operation intended for only state "A". Namely, in the first and second loops, the verify operation applies voltage VfyA to the selected word line WL, without applying voltages VfyB to VfyG thereto. Subsequently, the third and fourth loops perform the verify operation intended for state "A" and state. "B". Namely, in the third and fourth loops, the verify operation sequentially applies voltages VfyA and VfyB to the selected word line WL, without applying voltages VfyC to VfyG thereto.

The fifth and sixth loops perform the verify operation intended for state "A", state "B", and state "C". Namely, in the fifth and sixth loops, the verify operation subsequently applies voltages VfyA, VfyB, and VfyC to the selected word line WL, without applying voltages VfyD to VfyG thereto. The verify operation intended for state "A" is completed in the sixth loop. This is because the program operation for state "A" is statistically completed in the sixth loop count.

The seventh and eighth loops perform the verify operation intended for state "B", state "C", and state "D". Namely, in the seventh and eighth loops, the verify operation sequentially applies voltages VfyB, VfyC, and VfyD to the selected word line WL, without applying voltages VfyE to VfyG thereto. The verify operation intended for state "B" is completed in the eighth loop.

The ninth and tenth loops perform the verify operation intended for state "C", state "D", and state "E". Namely, in the ninth and tenth loops, the verify operation subsequently applies voltages VfyC, VfyD, and VfyE to the selected word line WL, without applying voltages VfyF and VfyG thereto. The verify operation intended for state "C" is completed in the tenth loop.

The loop is subsequently repeated up to 19 times in a similar manner until writing of data corresponding to state "G".

That is, the verify operation for state "A" is performed from the first to sixth loops. The verify operation for state "B" is performed from the third to eighth loops. The verify operation for state "C" is performed from the fifth to tenth loops. The verify operation for state "D" is performed from the seventh to twelfth loops. The verify operation for state "E" is performed from the ninth to fourteenth loops. The verify operation for state "F" is performed from eleventh to sixteenth loops. The verify operation for state "G" is performed from the fourteenth to nineteenth loops.

FIG. 13 is a diagram showing a relation between the number of times the write operation is performed, and a voltage of a bit line BL per state according to a threshold distribution after each write operation. In FIG. 13, notation "1" indicates that data "1" is given to a corresponding bit line BL (program. "1"), while notation "0" indicates that data "0" is given thereto (program "0").

As shown in FIG. 13, for a memory cell transistor MT to maintain its threshold voltage within state "Er", data "1" is given to a corresponding bit line BL throughout all the loops. That is, during the entire write operation, a corresponding select transistor ST1 is constantly in a cutoff state.

In the case of a target state of a threshold voltage being state "A", that is, with respect to a memory cell transistor MT whose threshold value should be increased from a value within a range of state "Er" to a value within a range of state "A", program "0" is performed from the first to sixth loops. This operation corresponds to a loop in which the verify operation for state "A" is performed. Data "0" is given to a corresponding bit line BL until the memory cell transistor MT concerned passes the verify operation. Data "1" is given to the bit line LB after the memory cell transistor MT concerned has passed. In the loops subsequent to the seventh loop in which the program operation is completed, data "1" is continuously given to the bit line BL and data write is inhibited.

In the case of a target state of a threshold value being state "B", that is, with respect to a memory cell transistor MT whose threshold value should be increased from a value within a range of state "Er" to a value within a range of state "B", program "0" is performed from the first to eighth loops. The program operation is performed in a similar manner for states "C" to "G".

Figure 14A:
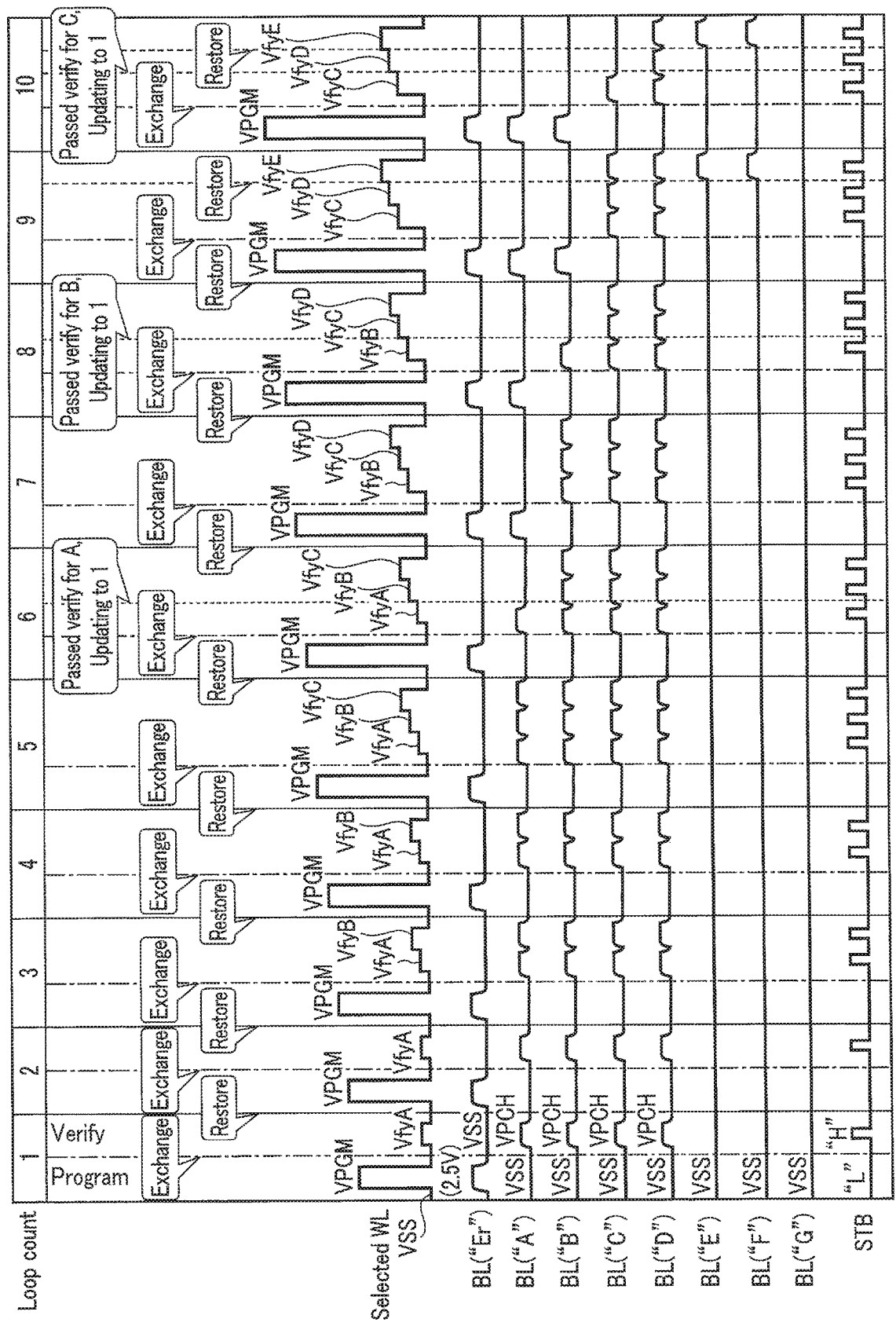
FIGS. 14A and 14B are timing charts each showing voltages of interconnects and signals in the write operation of the semiconductor memory device according to one embodiment.
Figure 14B:
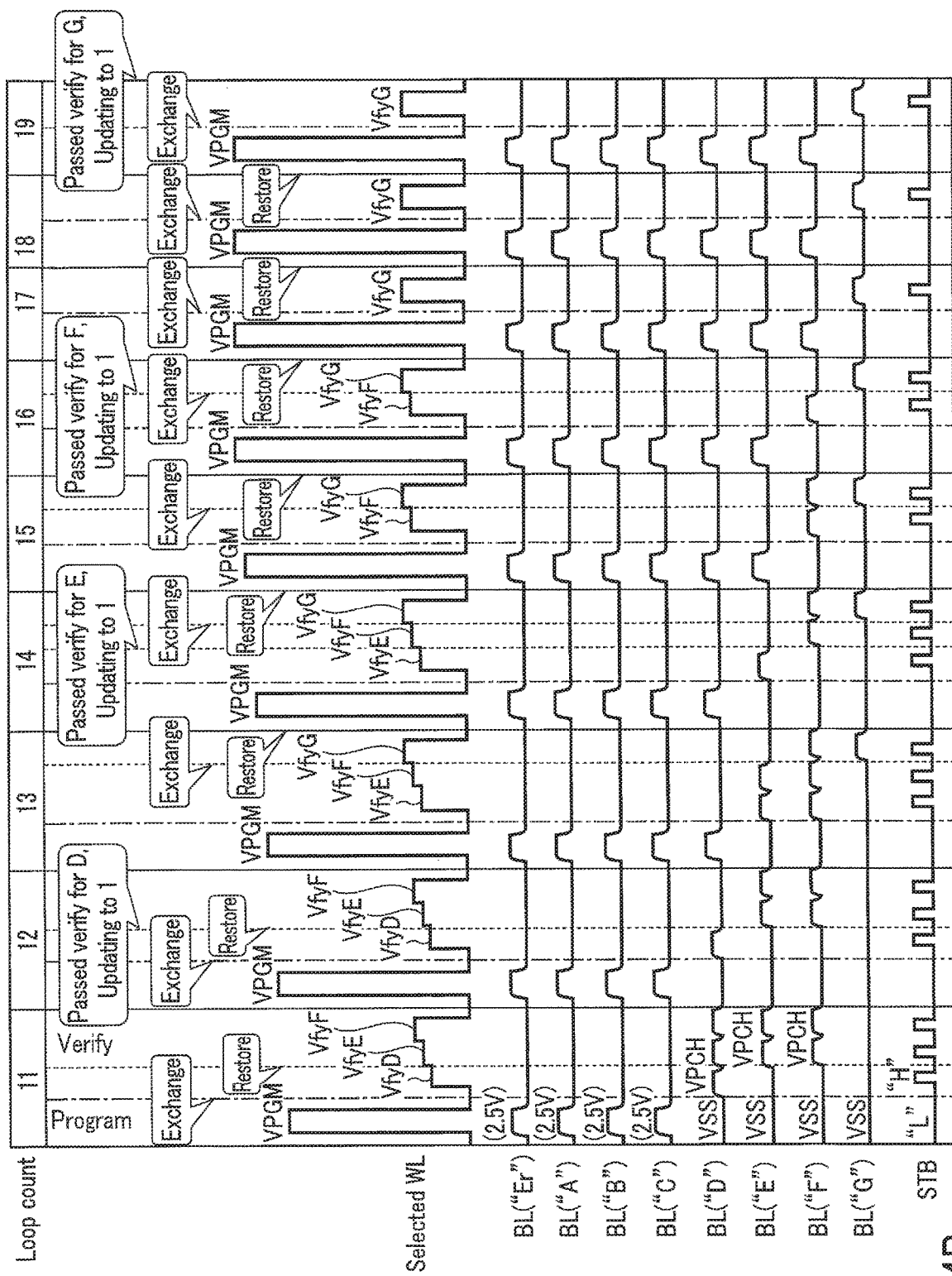

Voltages of interconnects and latch circuits during these operations will be described with reference to FIGS. 14A and 14E, and FIGS. 15A to 15N. Voltages are illustrated based on the same temporal axis; however, they are divided in FIGS. 14A and 14E due to space limitation. FIGS. 14A and 14B illustrate change in voltage over time from the first to nineteenth loops, and in particular, change in voltage of a selected word line WL, change in voltage of bit lines BL (hereinafter, referred to as bit lines BL("Er") to BL("G")) into which data corresponding to state "Er" to state "G" is written, and change in voltage of signal STB in the sense amplifier unit SAU. FIGS. 15A to 15N each show data stored in latch circuits SDL, ADL, and BDL, which correspond to a bit line BL during the write operation.

As shown in FIG. 14A, program "0" is performed on the bit lines BL ("A") to BL("G") in the first loop. Namely, voltage VPGM is applied to the selected word line NL, voltage Vinhibit (for example, 2.5 V) is applied to the bit line BL ("Er"), and for example, voltage VSS is applied to the bit lines BL ("A") to BL ("G"). Voltage Vinhibit is a voltage to cut off the select transistor ST1 when voltage VSG (a voltage to be applied to a select gate line SGD of a selected string unit SU) is applied to a gate of the select transistor ST1.

Next, the verify operation is performed. At this time, data is exchanged between the latch circuit SDL and the latch circuit ADL. This state corresponds to a transition from FIG. 15A to FIG. 15B. FIG. 15A shows a state before data is exchanged. FIG. 15B shows a state after data has been exchanged. As shown in FIGS. 15A and 15B, data stored in the latch circuit SDL is transferred to the latch circuit ADL, and data stored in the latch circuit ADL is transferred to the latch circuit SDL.

Then, the verify operation for state "A" is performed. That is, verify voltage VfyA is applied to a selected word line WL. At this time, as shown in FIG. 15B, data "0" is stored in the latch circuits SDL respectively corresponding to states "A" to "D", so that the bit lines BL("A") to BL("D") are pre-charged.

Thereafter, data exchanged between the latch circuit SDL and the latch circuit ADL is restored. This state corresponds to a transition from FIG. 15B to FIG. 15C. FIG. 15C shows a state after exchanged data has been restored. As shown in FIG. 15C, data stored in the latch circuit SDL is restored to the latch circuit ADL, and data stored in the latch circuit ADL is restored to the latch circuit SDL.

In the second loop, program "0" is performed on the bit line BL("A") which has failed the verify operation for state "A" in the first loop, and the bit lines BL("B") to BL("G"). At this time, voltage VPGM to be applied to a selected word line WL is stepped up from that of the program operation in the first loop. Next, the verify operation is performed. At this time, data is exchanged between the latch circuit SDL and the latch circuit ADL as in the first loop. The verify operation for state "A" is performed as in the first loop. Thereafter, data exchanged between the latch circuit. SDL and the latch circuit ADL is restored, as in the first loop.

In the third loop, program. "0" is performed on the bit line BL("A") which has failed the verify operation for state "A" in the second loop, and the bit lines BL("B") to BL("G"). At this time, voltage VPGM to be applied to a selected word line WL is stepped up from that of the program operation in the second loop. Next, the verify operation for state "A" and the verify operation for state "B" are sequentially performed. In the verify operation for state "A", data is exchanged between the latch circuit SDL and the latch circuit ADL as in the first and second loops. Then, the verify operation for state "A" is performed as in the first and second loops. The verify operation for state "B" applies verify voltage VfyB to a selected word line WL. At this time, data "0" is stored in the latch circuits SDL respectively corresponding to states "A" to "D", so that the bit lines. BL("A") to BL("D") are pre-charged. Thereafter, data exchanged between the latch circuit SDL and the latch circuit ADL is restored, as in the first and second loops.

Similar processing is repeated, and in the sixth loop, program "0" is performed on the bit lines BL("A") to BL("C") which have failed the verify operations for states "A" to "C" in the fifth loop, and the bit lines BL("D") to BL ("G") this time, voltage VPGM to be applied to a selected word line WL is stepped up from that of the program operation in the fifth loop.

Next, the verify operation for state "A", the verify operation for state "B", and the verify operation for state "C" are sequentially performed. In the verify operation for state "A", data is exchanged between the latch circuit SDL and the latch circuit ADL as in the first to fifth loops. This state corresponds to a transition from FIG. 15A to FIG. 15B. Then, the verify operation for state "A" is performed as in the first to fifth loops. The latch circuits SDL, ADL, and BDL each corresponding to state "A" are updated to data "1" because the memory cell transistors MT corresponding to their latch circuits have passed the verify operation for state "A". This state corresponds to a transition from FIG. 15B to FIG. 15D. FIG. 15D shows a state after data is updated to data "1". The verify operation for state "B" applies verify voltage VfyB to a selected word line WL. At this time, as shown in FIG. 15D, data "0" is stored in the latch circuits SDL respectively corresponding to states "B" to "D", so that the bit lines BL("B") to BL("D") are pre-charged. The verify operation for state "C" applies verify voltage VfyC to a selected word line WL. At this time, data "0" is stored in the latch circuits SDL respectively corresponding to states "B" to "D", so that the bit lines BL("B") to BL ("D") are pre-charged.

Thereafter, data exchanged between the latch circuit SDL and the latch circuit ADL is restored, as in the first to fifth loops. This state corresponds to a transition from FIG. 15D to FIG. 15E. FIG. 15E shows a state after exchanged data has been restored.

In the ninth loop, program "0" is performed on the bit lines BL("C") and BL("D") which have failed the verify operations for states "B" to "D" in the eighth loop, and the bit lines BL("E") to BL("G"). At this time, voltage VPGM to be applied to a selected word line WL is stepped up from that of the program operation in the eighth loop.

Next, the verify operation for state "C", the verify operation for state "D", and the verify operation for state "E" are sequentially performed. In the verify operation for state "C", data is exchanged between the latch circuit SDL and the latch circuit ADL as in the first to eighth loops. This state corresponds to a transition from FIG. 15F to FIG. 15G. FIG. 15F shows a state before data is exchanged. FIG. 15G shows a state after data has been exchanged. The verify operation for state "C" applies verify voltage VfyC to a selected word line WL. At this time, as shown in FIG. 15G, data "0" is stored in the latch circuits SDL respectively corresponding to states "C" and "D", so that the bit lines BL("C") and BL ("D") are pre-charged. The verify operation for state "D" applies verify voltage VfyD to a selected word line WL. At this time, data "0" stored in the latch circuits SDL respectively corresponding to states "C" and "D", so that the bit lines BL("C") and BL("D") are pre-charged.

After the verify operation for state "D", data exchanged between the latch circuit SDL and the latch circuit ADL is restored. This state corresponds to a transition from FIG. 15G to FIG. 15H. FIG. 15H shows a state after exchanged data has been restored. The verify operation for state "E" applies verify voltage VfyE to a selected word line WL. At this time, as shown in FIG. 15H, data "0" is stored in the latch circuits SDL respectively corresponding to states "C" to "F", so that the bit lines BL("C") to BL("F") are pre-charged. Thereafter, data is not restored.

In the thirteenth loop, program "0" is performed on the bit lines BL("E") and BL ("F") which have failed the verify operations for states "D" to "F" in the twelfth loop, and the bit line BL("G"). At this time, voltage VPGM to be applied to a selected word line WL is stepped up from that of the program operation in the twelfth loop.

Next, the verify operation for state "E", the verify operation for state "F", and the verify operation for state "G" are sequentially performed. In the verify operation for state "E", data is not exchange. The verify operation for state "E" applies verify voltage VfyE to a selected word line WL. At this time, as shown in FIG. 15I, data "0" is stored in the latch circuits SDL respectively corresponding to states "E" and "F", so that the bit lines BL("E") and BL("F") are pre-charged. The verify operation for state "F" applies verify voltage VfyF to a selected word line WL. At this time, data "0" is stored in the latch circuits SDL respectively corresponding to states "E" and "F", so that the bit lines BL ("E") and BL("F") are pre-charged.

After the verify operation for state "F", data is exchanged between the latch circuit SDL and the latch circuit BDL. This state corresponds to a transition from FIG. 15I to FIG. 15J. FIG. 15I shows a state before data is exchanged. FIG. 15J shows a state after data has been exchanged. The verify operation for state "G" applies verify voltage VfyG to a selected word line WL. At this time, as shown in FIG. 15J, data "0" is stored in the latch circuits SDL respectively corresponding to states "F" and "G", so that the bit lines BL("F") and BL("G") are pre-charged.

Thereafter, data exchanged between the latch circuit SDL and the latch circuit BDL is restored. This state corresponds to a transition from FIG. 15J to FIG. 15K. FIG. 15K shows a state after exchanged data has been restored.

In the fifteenth loop, program "0" is performed on the bit lines BL("F") and BL("G") which have failed the verify operations for states "E" to "G" in the fourteenth loop. At this time, voltage VPGM to be applied to a selected word line WL is stepped up from that of the program operation in the fourteenth loop.

Next, the verify operation for state "F" and the verify operation for state "G" are sequentially performed. In the verify operation for state "F", data is not exchanged. The verify operation for state "F" applies verify voltage VfyF to a selected word line WL. At this time, as shown in FIG. 15L, data "0" is stored in the latch circuit SDL corresponding to state "F", so that the bit line BL("F") is pre-charged.

After the verify operation for state "F", data is exchanged between the latch circuit SDL and the latch circuit BDL, as in the thirteenth loop. This state corresponds to a transition from FIG. 15L to FIG. 15M. FIG. 15L shows a state before data is exchanged. FIG. 15M shows a state after data has been exchanged. The verify operation for state "G" applies verify voltage VfyG to a selected word line WL. At this time, as shown in FIG. 15M, data "0" is stored in the latch circuits SDL respectively corresponding to states "F" and "G", so that the bit lines BL("F") and BL("G") are pre-charged.

Thereafter, data exchanged between the latch circuit SDL and the latch circuit BDL is restored, as in the thirteenth loop. This state corresponds to a transition from FIG. 15M to FIG. 15N. FIG. 15N shows a state after exchanged data has been restored.

When the above loops are described while focusing on the bit line BL ("A"), for example, pre-charge voltage VPCH is applied to the bit line BL("A") in the first to sixth loops in which the verify operation for state "A" is performed, whereas pre-charge voltage VPCH is not applied to the bit line BL("A") in the seventh to nineteenth loops.

1.4 Advantageous Effect According to Present Embodiment

The configuration according to the present embodiment can reduce power consumption. This advantageous effect will be described below.

The present embodiment includes two or more latch circuits (for example, SDL, ADL, and BDL). In the program operation, two or more bits composing program data are respectively stored in the latch circuits. Based on arithmetic results of the data stored in these latch circuits, the program operation is performed. On the other hand, in the verify operation, data is exchanged between the latch circuit SDL and the latch circuit ADL or BDL. The verify operation is performed by applying a pre-charge voltage based on data that is stored in the latch circuit SDL, after exchange of data.

After exchange of data between the latch circuit SDL and the latch circuit ADL or BDL, only a part of the sense amplifier units SAU in the latch circuit SDL of which stores data "0" apply a pre-charge voltage to corresponding bit lines BL, Accordingly, by appropriately exchanging data between the latch circuit SDL and the latch circuit ADL or BDL, while it is possible to apply a pre-charge voltage to a bit line BL coupled to a memory cell as a subject of the verify operation, the number of bit lines BL to which a pre-charge voltage is applied can be regulated, according to data (data "0" or data "1") stored in the respective latch circuits SDL. Specifically, with the threshold distributions being defined as in FIG. 6, no pre-charge voltage is applied to a bit line BL coupled to a memory cell to be programmed with "Er" state which could function as a large current path. Therefore, this power consumption can be reduced as compared to the case in which a pre-charge voltage is applied with respect to all states according to threshold distributions.

In the present embodiment, data written in the latch circuit SDL temporarily saved in the node SEN in the data exchange operation during the verify operation. Next, after data stored in the latch circuit ADL is transferred to the latch circuit SDL, the write data is transferred from the node SEN to the latch circuit ADL. Furthermore, during a period after the verify operation and before the program operation, the exchanged data is restored as in the exchange operation. This achieves a reduction of power consumption while preventing loss of write data. Since write data is not lost, there is no need to obtain write data again from the controller, and a decrease in operation speed can be suppressed.

2. Modifications, Etc

As described above, a semiconductor memory device according to the embodiment includes: a first bit line (one of BL("A") to BL("G")); a first memory cell that is electrically coupled to the first bit line and is configured to store at least two-bit data; and a first sense amplifier that is configured to sense and store data read out to the first bit line. The first sense amplifier includes a first latch circuit (SDL) and a second latch circuit (ADL). A data write operation is performed by repeating a loop including a program operation and a first verify operation. In the program operation, each of the first and second latch circuits stores any one bit of the at least two-bit data. In the first verify operation, data is exchanged between the first latch circuit (SDL) and the second latch circuit (ADL) when performing the first verify operation (i.e., verify target: one of "A" to "D" states) for a first data (i.e., one of data corresponding to state "A", data corresponding to state "B", data corresponding to state "C", and data corresponding to state "D") indicated by the at least two-bit data. The first verify operation (i.e., verify target: one of states "E" and "F") for a second data (i.e., one of data corresponding state "E" and data corresponding to state "F") indicated by the at least two-bit data is performed without exchanging data between the first latch circuit (SDL) and the second latch circuit (ADL).

The embodiment is not limited to the configurations explained above and can be modified in various ways. For example, the way of allocation between threshold distributions and three-bit data is not limited to the way shown in FIG. 6. The control circuit 5 may determine, based on the allocation between threshold distributions and three-bit data, whether or not to exchange data between the latch circuit SDL corresponding to a state of a threshold distribution as a verify target, and the latch circuit ADL or BDL. Namely, how to exchange data may depend on how to allocate threshold distributions to three-bit data as described with reference FIG. 6, for example. In such a case, depending on how threshold distributions are allocated to three-bit data, the control circuit 5 may determine how to exchange data between latch circuits in such a manner as to reduce the number of bit lines BL to which a pre-charge voltage is applied in the verify operation, for example. Namely, t control circuit 5 may determine whether or not to exchange data between the latch circuit SDL and the latch circuit ADL or SDL, and if data is to be exchanged, which one of the latch circuits ADL and BDL to use.

For the execution of the above, for example, a ROM fuse within the memory cell array 2 may store a table. This table holds a relation between allocation of threshold distributions to three-bit data (see FIG. 6), and a data exchange method to be employed if the aforementioned allocation is performed. The control circuit 5 reads out the table when, for example, the power is turned on, and obtains information on the allocation from the controller. Based on the obtained information and the table, the control circuit 5 employs an appropriate method to exchange data.

The above embodiment was described based on the case in which the verify operation is continuously performed on a plurality of states corresponding to threshold distributions; however, the embodiment is not limited to the verify operation that is continuously performed.

In the above embodiment, the data exchange operation and the data restore operation using the latch circuits SDL, ADL, and BDL were described. However, the embodiment is not limited to the case using these latch circuits, and is applicable to the case using three latch circuits freely selected from the latch circuits XDL, SDL, ADL, and BDL. Furthermore, the operations between the latch circuits is not limited to those illustrated in FIGS. 9A to 9F. Namely, any operation can be performed as long as the operation realizes data transfer between the latch circuits.

The above embodiment was described based on the case using a three-bit memory cell; however, this case is not a limitation. The embodiment is applicable to a case using a memory cell composed of two bits or more. In the case of a memory cell composed of two bits, the number of latch circuits may be two or more.

In addition, in the above embodiments the case in which a NAND flash memory is used as an example of a semiconductor memory was described. However, the embodiments are applicable to all other types of a semiconductor memory in addition to a NAND flash memory, and are further applicable to various types of a memory device other than a semiconductor memory. In the flowcharts described in the above embodiments, the order of processing may be shuffled to the extent possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first bit line;
a first memory cell electrically coupled to the first bit line and configured to store at least two-bit data; and
a first sense amplifier configured to sense and store data read out to the first bit line, wherein:
the first sense amplifier includes a first latch circuit and a second latch circuit;
a data write operation is performed by repeating a loop including a program operation and a first verify operation;
in the program operation, each of the first and second latch circuits stores any one bit of the at, least two-bit data; and
in the first verify operation, data is exchanged between the first latch circuit and the second latch circuit when performing the first verify operation for a first data indicated by the at least two-bit data, and the first verify operation for a second data indicated by the at least two-bit data is performed without exchanging data between the first latch circuit and the second latch circuit.

2. The device according to claim 1, wherein the first bit line is pre-charged in accordance with data stored in the first latch circuit.

3. The device according to claim 1, wherein after the first verify operation for the first data is performed, data exchanged between the first latch circuit and the second latch circuit is restored.

4. The device according to claim 3, wherein after data exchanged between the first latch circuit and the second latch circuit is restored, the program operation is performed based on arithmetic results of data stored in the first and second latch circuits.

5. The device according to claim 1, wherein a threshold voltage corresponding to the second data is higher than a threshold voltage corresponding to the first data.

6. The device according to claim 1, wherein when the first memory cell passes the first verify operation, data is updated in the first latch circuit and the second latch circuit.

7. The device according to claim 1, wherein:
the first sense amplifier further includes a third latch circuit;
in the program operation, the third latch circuit stores any one bit of the at least two-bit data;
in the first verify operation, the first verify operation for the second data indicated by the at least two-bit data is performed without exchanging data between the first latch circuit and the third latch circuit; and
when the first verify operation for a third data indicated by the at least two-bit data is performed, data is exchanged between the first latch circuit and the third latch circuit.

8. The device according to claim 7, wherein after the first verify operation for the third data is performed, data exchanged between the first latch circuit and the third latch circuit is restored.

9. The device according to claim 8, wherein after data exchanged between the first latch circuit and the third latch circuit is restored, the program operation is performed based on arithmetic results of data stored in the first and third latch circuits.

10. The device according to claim 7, wherein a threshold voltage corresponding to the third data is higher than a threshold voltage corresponding to the second data.

11. The device according to claim 7, wherein when the first memory ell passes the first verify operation, data is updated in the first latch circuit and the third latch circuit.

12. The device according to claim 1, wherein the loop of the data write, operation further includes a second verify operation to be performed after the first verify operation.

13. The device according to claim 12, wherein:
when the first verify operation for the first data is performed in the first verify operation and the second verify operation for a third data indicated by the at least two-bit data is performed in the second verify operation,
the second verify operation is performed while data exchanged between the first latch circuit and the second latch circuit in the first verify operation is maintained without change.

14. The device according to claim 13, wherein a threshold voltage corresponding to the third data is higher than a threshold voltage corresponding to the first data.

15. The device according to claim 12, wherein:
when the first verify operation for the first data is performed in the first verify operation and the second verify operation for the second data is performed in the second verify operation,
the second verify operation is performed after data exchanged between the first latch circuit and the second latch circuit in the first verify operation is restored.

16. The device according to claim 15, wherein a threshold voltage corresponding to the second data is higher than a threshold voltage corresponding to the first data.

17. The device according to claim 12, wherein:
when the first verify operation for the second data is performed in the first verify operation and the second verify operation for a third data indicated by the at least two-bit data is performed in the second verify operation,
the second verify operation is performed without exchanging data between the first latch circuit and the second latch circuit.

18. The device according to claim 17, wherein a threshold voltage corresponding to the third data is higher than a threshold voltage corresponding to the second data.

19. The device according to claim 12, wherein:
the first sense amplifier further includes a third latch circuit;
in the program operation, each of the first to third latch circuits stores any one bit of the at least two-bit data;
when the first verify operation for the second data is performed in the first verify operation and the second verify operation for a third data indicated by the at least two-bit data is performed in the second verify operation,
data is exchanged between the first latch circuit and the third latch circuit.

20. The device according to claim 19, wherein a threshold voltage corresponding to the third data is higher than a threshold voltage corresponding to the second data.

* * * * *